(12) United States Patent
Saha et al.

(10) Patent No.: US 7,298,149 B2
(45) Date of Patent: Nov. 20, 2007

(54) FAULT LOCATION USING MEASUREMENTS OF CURRENT AND VOLTAGE FROM ONE END OF A LINE

(75) Inventors: Murari Mohan Saha, Västerås (SE); Jan Izykowski, Wroclaw (PL); Eugeniusz Rosolowski, Wroclaw (PL)

(73) Assignee: ABB A.B., Västerås (SE)

( * ) Notice: Subject to any disclaimer, the term of this patent is extended or adjusted under 35 U.S.C. 154(b) by 0 days.

(21) Appl. No.: 10/518,430

(22) PCT Filed: Jun. 18, 2003

(86) PCT No.: PCT/SE03/01091

§ 371 (c)(1),
(2), (4) Date: Dec. 27, 2005

(87) PCT Pub. No.: WO04/001431

PCT Pub. Date: Dec. 31, 2003

(65) Prior Publication Data

US 2006/0097728 A1    May 11, 2006

(30) Foreign Application Priority Data

Jun. 20, 2002    (SE)    .................................... 0201911

(51) Int. Cl.
*G01R 31/08*    (2006.01)

(52) U.S. Cl. ................ 324/512; 324/521; 324/522; 324/525; 324/531

(58) Field of Classification Search ............... 324/512, 324/522, 525
See application file for complete search history.

(56) References Cited

U.S. PATENT DOCUMENTS

| 4,107,778 | A | | 8/1978 | Nii et al. |
| 4,559,491 | A | | 12/1985 | Saha |
| 5,661,664 | A | * | 8/1997 | Novosel et al. ............. 700/293 |
| 6,476,613 | B2 | * | 11/2002 | Saha et al. ................... 324/522 |
| 7,221,166 | B2 | * | 5/2007 | Saha et al. ................... 324/522 |
| 2004/0167729 | A1 | * | 8/2004 | Saha et al. ..................... 702/58 |

FOREIGN PATENT DOCUMENTS

| SU | 761953 | 9/1980 |
| WO | WO 0358488 B1 | 6/1994 |

* cited by examiner

*Primary Examiner*—Walter Benson
(74) *Attorney, Agent, or Firm*—Venable LLP; Eric J. Franklin

(57) ABSTRACT

A method to locate a fault from one end of a section of a power line utilizing measurements of current, voltage and angles between the phases at a first end of said section. Symmetrical components of currents are calculated for the current and voltage measurement at the first end. A value of impedance is calculated for an extra link between the terminals with the impedance for the positive sequence. A compensation is determined for the shunt capacitance. The zero-sequence current is determined from the healthy line of a section of parallel power lines. A distance to a fault is calculated for the parallel line section. The distance to the fault from the first end is calculated. The fault is located utilizing the calculate distances.

24 Claims, 22 Drawing Sheets

FAULT LOCATION USING MEASUREMENTS OF CURRENT AND VOLTAGE FROM ONE END OF A LINE

CROSS-REFERENCE TO RELATED APPLICATIONS

This application claims priority to Swedish patent application 0201911-5 filed 20 Jun. 2002 and is the national phase under 35 U.S.C. § 371 filed 18 Jun. 2003.

TECHNICAL FIELD

The present invention is concerned with a fault location technique for a section of a power transmission line utilizing measurements of current and voltage made at terminals located at one end of the section of the power line.

BACKGROUND ART

Several methods and approaches for fault location in high voltage power transmission systems, and power distribution systems, have been developed and employed. One approach has been to use voltage/current transducers located at terminals located at each of two ends of a section of the power line to be monitored. Inductive current transformers are used to provide a measurement of instantaneous current in a transmission line.

U.S. Pat. No. 4,559,491 entitled Method and device for locating a fault point on a three-phase transmission line, describes a one-end fault location (FL) algorithm. High accuracy of fault location using a fault locator device at one end of a line is achieved by taking into account the actual distribution of a fault current in the transmission network. This algorithm has been successfully implemented into a product in 1982 and is in operation with single and parallel transmission lines in many countries around the world. However, for certain fault conditions it is difficult to obtain accurate pre-fault quantities, such as pre-fault currents, in order to calculate an estimate for voltage drop across the fault path. Also, a disadvantage of using phase voltages and currents and zero sequence components of currents is that it is relatively difficult using these values to compensate for shunt disadvantage of using phase voltages and currents and zero sequence components of currents is that it is relatively difficult using these values to compensate for shunt capacitance effects. In addition, the fault locator method described is not suitable for single and parallel line sections which have an extra link across the ends of the sections.

SUMMARY OF THE INVENTION

The aim of the present invention is to remedy one or more of the above mentioned problems.

This is obtained by a method characterised by claim 1. Specific features of the present invention are characterised by the appending claims.

In one aspect of the invention, a method comprising a new formulation of a one-end fault locator algorithm has been proposed. The uniform description of the transmission network in terms of symmetrical components as well as the generalized models of fault loops and faults have been applied. The resulting advantages include the algorithm can be used for locating faults in typical single and parallel transmission lines, and, in addition, fault location may also be carried out for both single and parallel lines with an extra link between the line ends. Another advantage is that a procedure for calculation of a distance to fault is in the form of a compact quadratic equation with the coefficients dependent on a fault type, acquired measurements and impedance data for the transmission network. Another advantage of the invention is that optimal estimation of the voltage drop across a fault path is applied, which has the result that the pre-fault currents in case of single phase-to-ground faults and phase-to-phase faults are no longer required.

In an embodiment, compensation for shunt capacitances is facilitated by means of the use of the notation of symmetrical components. The distributed long line model of the line has been applied for that. The compensation is performed individually for all the sequences. The currents for particular sequences are compensated for the shunt currents and then the fault loop compensated current is composed. In another embodiment improved accuracy has been obtained by means of an option to measure the source impedance at the remote end instead of using a representative value. The source impedance measured at the remote end may be considered as sent to the fault locator by using a simple communication means.

In another embodiment, a method for one end fault location for parallel lines to locate single phase-to-ground faults is described under a plurality of conditions. In another further embodiment a method is described for one end fault location with standard availability of the measured signals for ground faults including both single phase-to-ground faults and phase-to-phase-to-ground faults.

In another aspect of the invention, a fault locator device for carrying out the method of the invention is characterised by claim 18. Specific features of the inventive fault locator device are characterised by the appending claims.

In another aspect of the invention a computer program is described for carrying out the method according to the invention. In another aspect of the invention a computer program product comprising a computer program for carrying out the method of the invention is described. In another, further aspect of the invention a graphical user interface is described for displaying a distance to a fault from one end of a section of a power line.

BRIEF DESCRIPTION OF THE DRAWINGS

A more complete understanding of the method and system of the present invention may be had by reference to the following detailed description when taken in conjunction with the accompanying drawings wherein:

FIG. 12 shows fault types from a-g, and FIGS. 13a, 13b faults between phases a-b. FIG. 14 shows an a-b-g fault. FIGS. 15a and 15b show symmetrical faults a-b-c and a-b-c-g respectively;

FIG. 16 shows the case of a single line with an extra link between the substations. FIG. 17 shows the case of parallel lines with an extra link between the substations;

DESCRIPTION OF THE PREFERRED EMBODIMENTS

Figure 1:
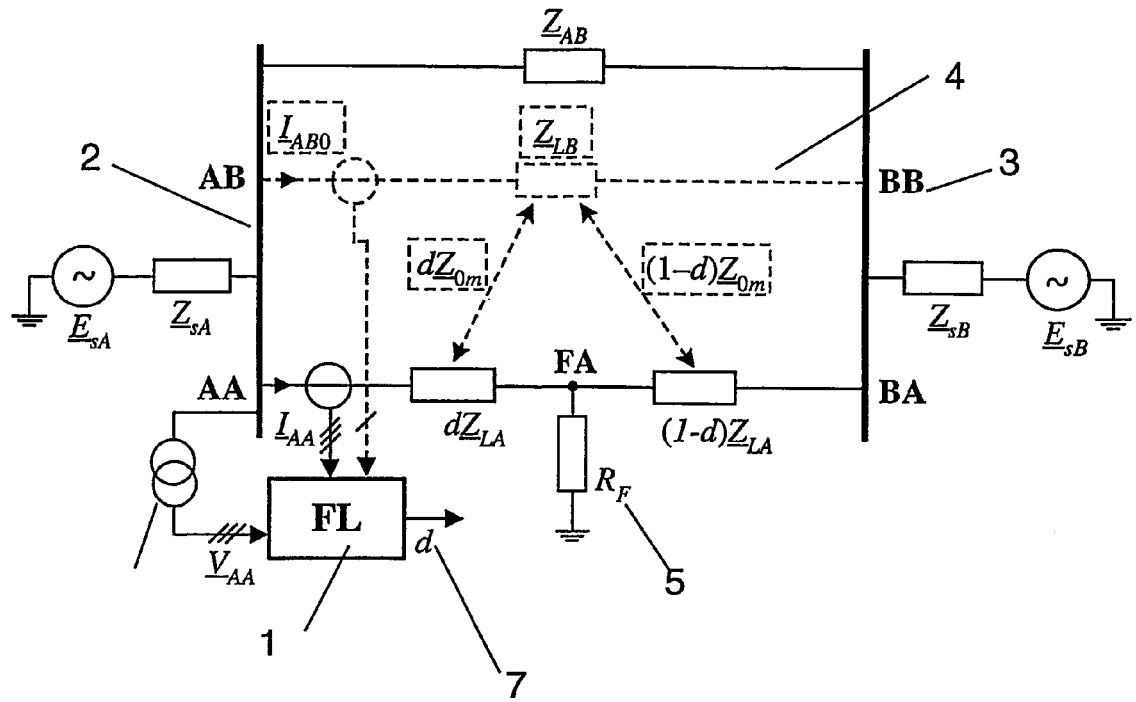
FIG. 1 shows in a single schematic diagram a method of fault location in power transmission and/or distribution systems for parallel lines and single lines according to an embodiment of the invention.

FIG. 1 presents a schematic diagram for one-end fault location applied for parallel lines and for a power transmission or distribution system with a single line. A fault locator 1 is positioned at one end 2 of a single line AA-BA 3 or parallel lines AA-BA, AB-BB, 4. A fault F is shown at FA with a corresponding fault resistance, 5, denoted as $R_F$. A value for distance to the fault d from one end 2 determined and provided by the fault locator 1 is indicated with the reference number 7. Components such as parallel line AB-BB and quantities such as a parallel line value zero sequence current $I_{AB0}$ shown with dotted lines are excluded when considering a single line case.

The fault locator 1 positioned at the first end 2, or 'A' end, is supplied with the following input signals:

three-phase voltages ($V_{AA}$) of the faulted line,
three-phase voltages ($I_{AA}$) of the faulted line,
zero sequence current ($I_{AB0}$) from the healthy parallel line (zero sequence is not present when the single line only is considered).

Figure 2A:
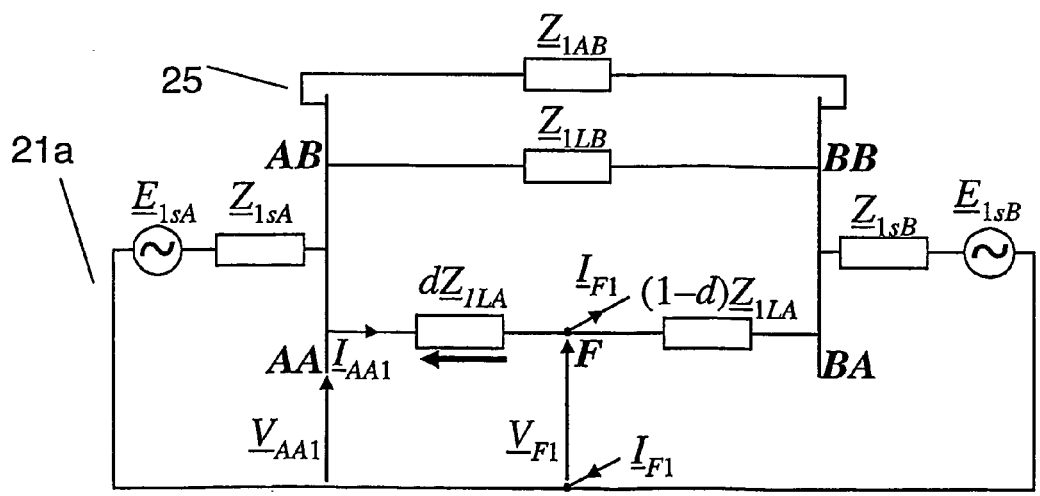
FIG. 2a shows a schematic circuit diagram for a parallel transmission network for the positive sequence component in which the fault loop is marked for the case of a fault locator installed at the terminal AA.

FIGS. 2a,b,c show circuit diagrams of a parallel transmission network for the positive 2a, negative 2b, and zero sequence 2c components. Fault loops for the sequence components 21a, 21b, 21c are shown for the case of a fault locator installed at the terminal AA. An extra link 25 between the terminals A, B is shown. A generalized model of the fault loop considered for different fault types is stated as:

$$V_{AA\_p} - dZ_{1LA}I_{AA\_p} - R_F(a_{F1}I_{F1} + a_{F2}I_{F2} + a_{F0}I_{F0}) = 0 \quad (1)$$

where:

d—unknown and sought distance to fault, $Z_{1LA}$—positive sequence impedance of the faulted line, $V_{AA\_p}$, $I_{AA\_p}$—fault loop voltage and current composed according to the fault type, $R_F$—fault resistance, $I_{Fi}$—sequence components of the total fault current (i=0, i=1, i=2), $a_{Fi}$—weighting coefficients (TABLE 2).

Fault loop voltage and current can be expressed in terms of the symmetrical components of measured voltages/currents:

$$V_{AA\_p} = a_1 V_{AA1} + a_2 V_{AA2} + a_0 V_{AA0} \quad (2)$$

$$I_{AA\_p} = a_1 I_{AA1} + a_2 I_{AA2} + a_0 \frac{Z_{0LA}}{Z_{1LA}} I_{AA0} + a_{0m} \frac{Z_{0m}}{Z_{1La}} I_{AB0} \quad (3)$$

where:

AA, AB—subscripts used for indicating measurements acquired from the faulted line (AA) and from the healthy line (AB), respectively, $a_0$, $a_1$, $a_2$—coefficients which are gathered in TABLE 1 (the Tables are arranged below at the end of the description of embodiments and derivation of these coefficients is shown in APPENDIX A1, also attached).

$Z_{0LA}$, $Z_{0m}$—impedance of the faulted line and mutual coupling between the lines for the zero sequence, respectively, $a_{0m} = a_0$—for parallel lines, $a_{0m} = 0$—for single lines.

The phasors of symmetrical components of voltages, positive: $V_{AA1}$, negative: $V_{AA2}$ and zero sequence: $V_{AA0}$ as well as the phasors of symmetrical components of currents, positive: $I_{AA1}$, negative: $I_{AA2}$, zero sequence from the faulted line: $I_{AA0}$ and zero sequence from the healthy line: $I_{AB0}$ are calculated from the acquired measurements as shown schematically in schematic block diagrams FIGS. 3a and 3b.

Figure 3A:
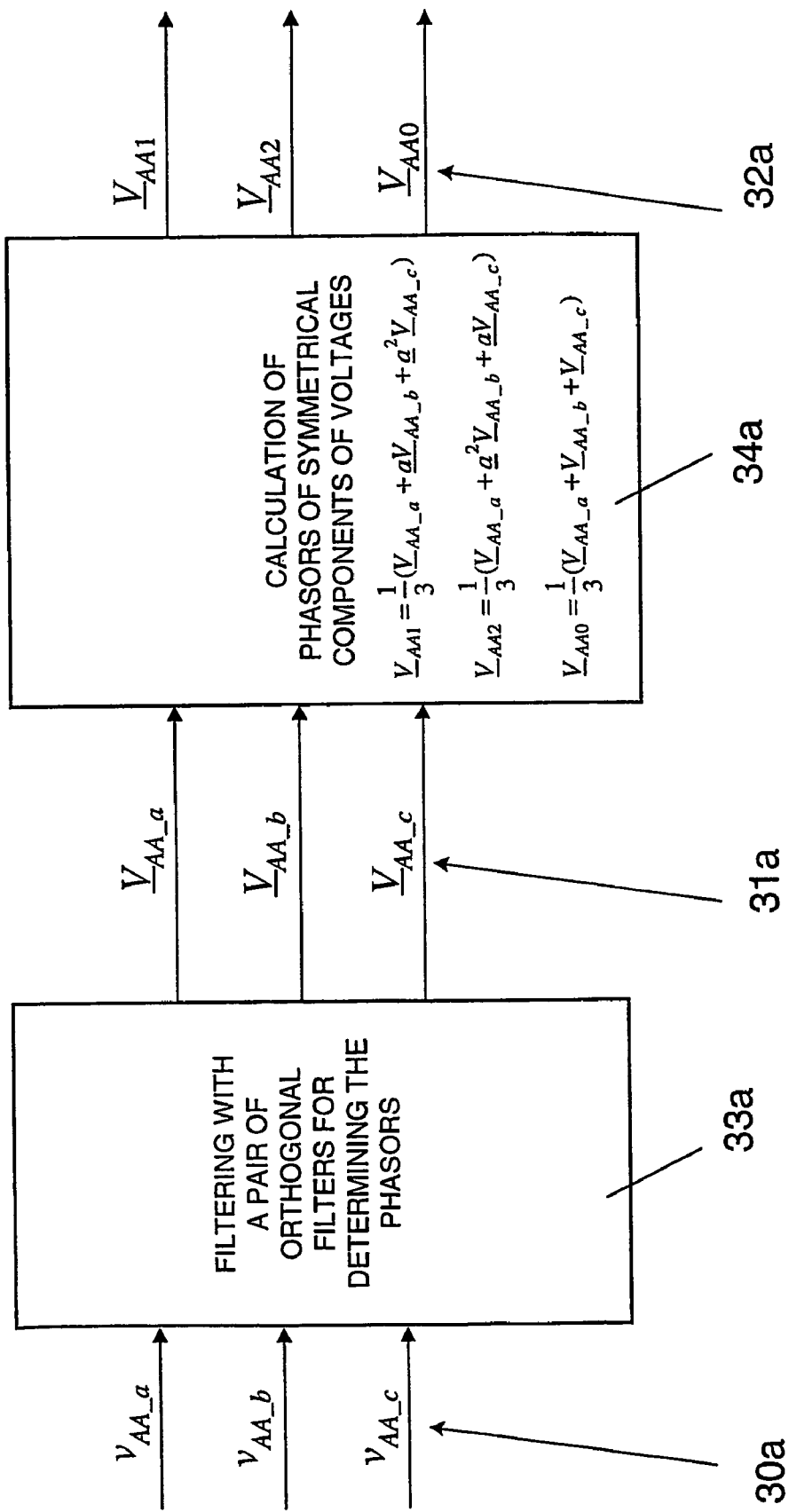
FIG. 3a is a schematic block diagram for obtaining and calculating the phasors of the symmetrical components of voltages and currents used for composing the fault loop voltage.
Figure 3B:
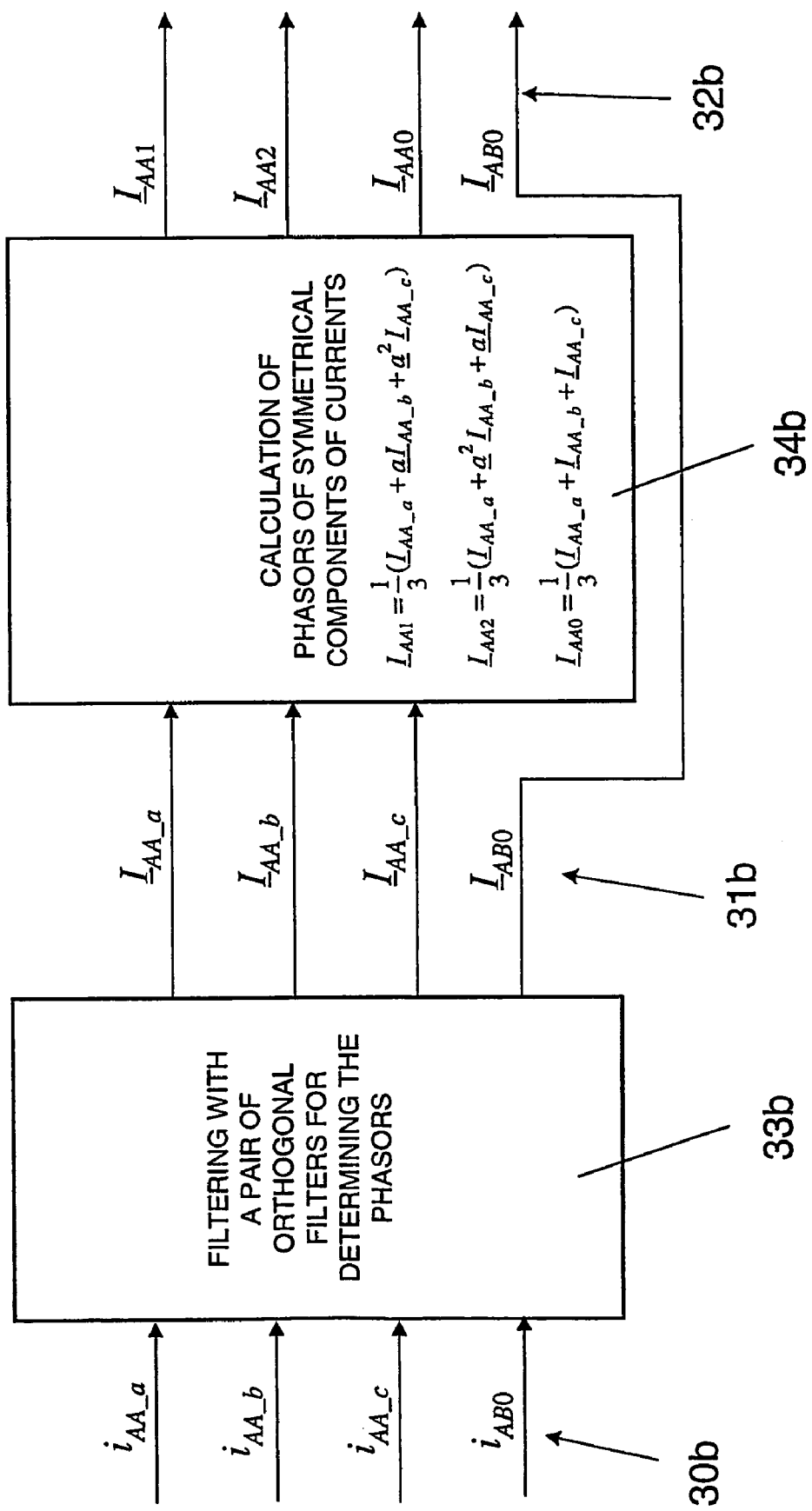
FIG. 3b shows a corresponding diagram for composing the fault loop current.

FIG. 3a shows an input of instantaneous phase voltages 30a, filtering stage 33a, phasors of phase voltages 31a, calculation of phasors of symmetrical components 33b and phasors of symmetrical components of voltages output at 32a. It may be seen from FIG. 3a that acquired phase voltage measurements are subjected to a filter, then calculations are made to find the symmetrical components of the fault loop voltage. FIG. 3b shows correspondingly stages used to find the symmetrical components of the fault loop current. FIG. 3b shows instantaneous phase currents and instantaneous zero sequence current from the healthy line 30b, filtering 33b, phasors of phase currents and phasor of zero sequence current from the healthy line 31b, calculation 34b and phasors of symmetrical components of currents output at 32b.

Fault loop signals may be composed according to formulae (2)-(3) and TABLE 1, which is the alternative to the classic approach (TABLE 1A, fault loop voltage ($V_{AA\_p}$) and current ($I_{AA\_p}$), which was used in the fault locator from [1-2].

Voltage drop across a fault path resistance, the third term in (1), can be expressed in terms of the current distribution factors and local measurements of currents which results in:

$$\underline{V}_{AA\_p} - d\underline{Z}_{1LA} \underline{I}_{AA\_p} - R_F \left( a_{F1} \frac{\Delta \underline{I}_{AA1}}{\underline{k}_{F1}} + a_{F2} \frac{\underline{I}_{AA2}}{\underline{k}_{F2}} + a_{F0} \frac{\underline{I}_{AA0}}{\underline{k}_{F0}} \right) = 0 \quad (4)$$

Formula (4) has been obtained from the following relations between the symmetrical components of a total fault current and measured currents:

$$\underline{I}_{F1} = \frac{\Delta \underline{I}_{AA1}}{\underline{k}_{F1}}, \quad \underline{I}_{F2} = \frac{\underline{I}_{AA2}}{\underline{k}_{F2}}, \quad \underline{I}_{F0} = \frac{\underline{I}_{AA0}}{\underline{k}_{F0}} \quad (5)$$

where:

$I_{F1}$; $I_{F2}$; $I_{F0}$—symmetrical components of a total fault current, $k_{F1}$, $k_{F2}$, $k_{F0}$—fault current distribution factors for particular sequence quantities, $\Delta I_{AA1} = I_{AA1} - I_{AA1pre}$; $I_{AA2}$; $I_{AA0}$—symmetrical components of currents measured in the line A at the station A (subscript AA); note that in case of the positive sequence the incremental quantity (post-fault current minus pre-fault current) is used.

Voltage drop across the fault path, as shown in the third term in equation (1), is expressed using sequence components of the total fault current. The weighting coefficients $a_{F0}$, $a_{F1}$, $a_{F2}$, can accordingly be determined by taking the boundary conditions for particular fault type. See TABLE 2, Alternative sets of the weighting coefficients for determining a voltage drop across the fault path resistance. Examples of derivation of these coefficients are contained in APPENDIX A2.

There is some freedom for setting the weighting coefficients. It is proposed to utilize this freedom firstly for avoiding zero sequence quantities, since the zero sequence impedance of a line may be considered as an unreliable parameter. This can be accomplished by setting $a_{F0}=0$ as shown in TABLE 2.

Secondly, the freedom in establishing the weighting coefficients can be utilized for determining the preference for using particular quantities. The negative sequence (TABLE 2, set I) or the positive sequence (TABLE 2, set II) can be preferred as well as possibly both types of the quantities (TABLE 2, set III) can be used for determining the voltage drop across the fault path.

The set I is recommended for further use, thus avoiding the positive sequence, and thus avoiding the pre-fault positive sequence current, for the largest number of faults. Avoiding the pre-fault positive sequence current is highly desirable since sometimes the pre-fault currents—due to certain reasons—can not be recorded or registered, but may be contaminated by one or more the symptoms of the occurring fault. Moreover, the accuracy of recording the pre-fault currents, which are basically lower than the post-fault currents, is not very great. This is so since the A/D converters operate with less accuracy in the low range.

Figure 4:
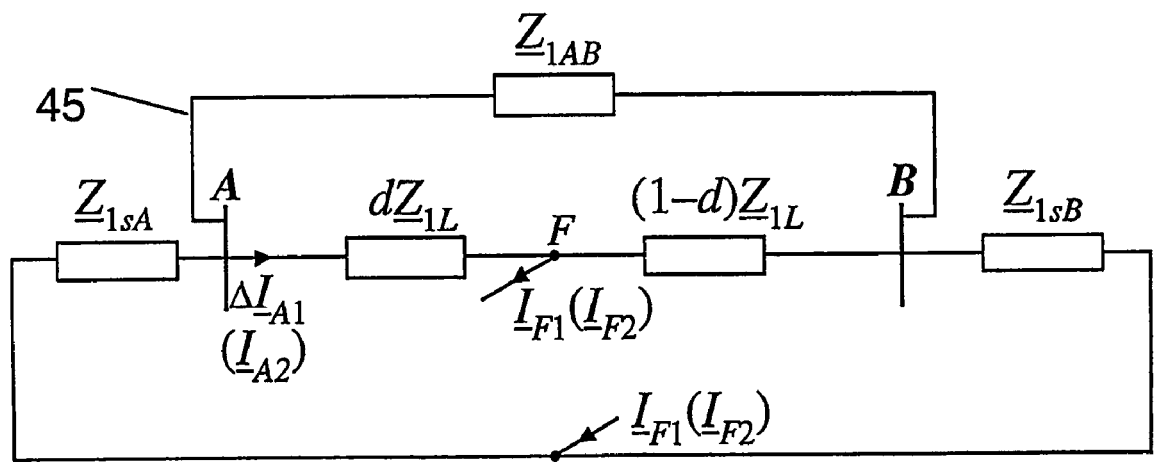
FIG. 4 shows a circuit diagram for determining the fault current distribution factor for the positive sequence of a single line, in which diagram quantities for the negative sequence are shown indicated in brackets.
Figure 5:
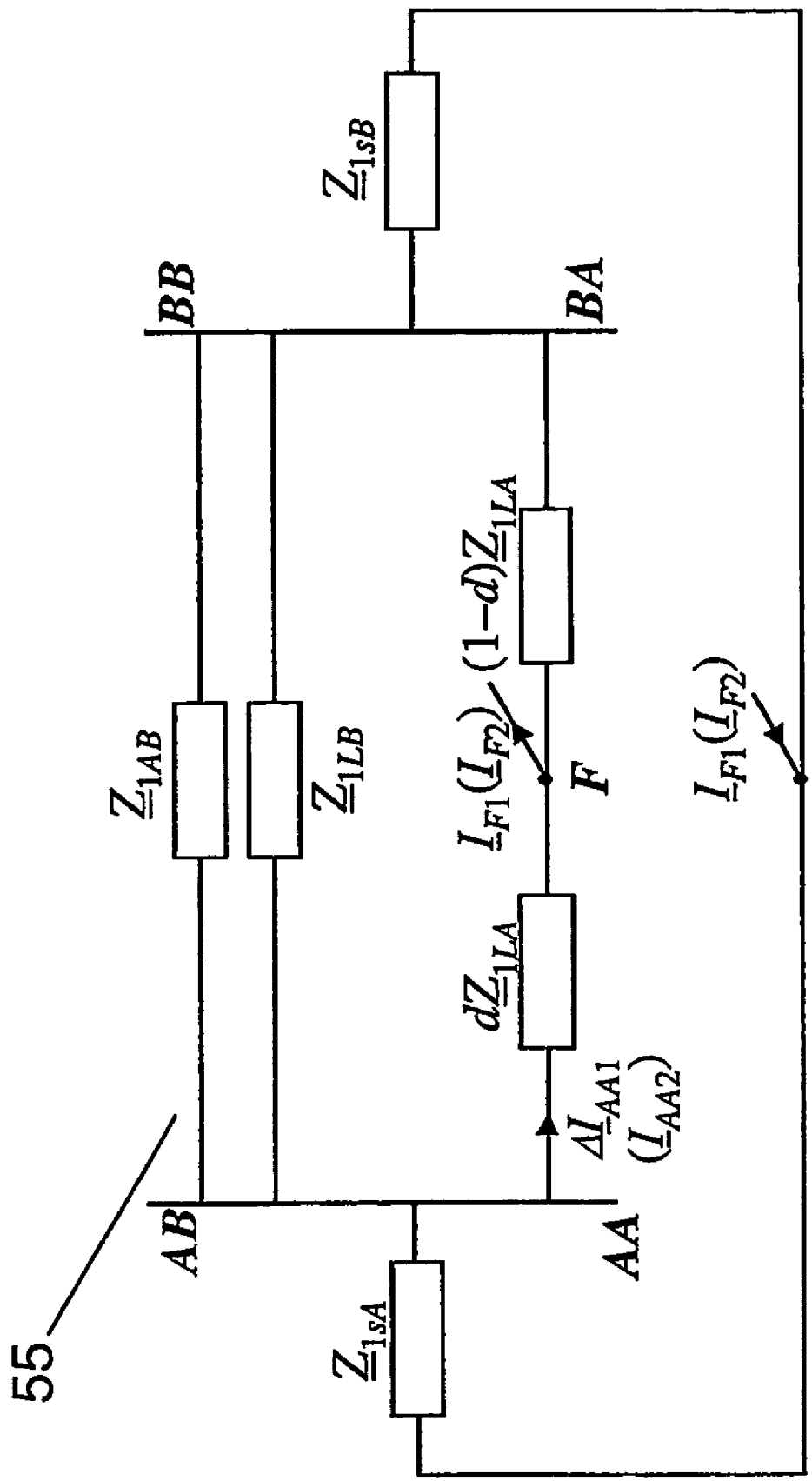
FIG. 5 shows a circuit diagram corresponding to FIG. 4 for single lines for determining the fault current distribution factor for the positive sequence of parallel lines, in which quantities for the negative sequence are also shown indicated in brackets.

Fault current distribution factors depend on the configuration of the transmission network, FIGS. 4, 5, and impedance parameters. Basically, all impedances for the positive and for the negative sequence are equal to each other and thus one obtains:

$$\underline{k}_{F1} = \underline{k}_{F2} = \frac{\underline{K}_1 d + \underline{L}_1}{\underline{M}_1} \quad (6)$$

Coefficients in a fault current distribution factor (6) for a single (FIG. 4) and for parallel lines (FIG. 5) are gathered in TABLE 3, Coefficients for determining a fault current distribution factor, (note that derivation of the coefficients is shown in APPENDIX A3).

FIG. 4 shows a circuit diagram of a single line for determining the fault current distribution factor for the positive sequence currents and with the negative sequence currents such as shown in brackets. Similarly FIG. 5 shows a circuit diagram of parallel lines for determining the fault current distribution factor with positive sequence currents wherein the negative sequence currents are shown in brackets.

In FIG. 4 the extra link 45 between the terminals A, B having impedance for the positive sequence equal to: $Z_{1AB}$ can be considered as existing ($Z_{1AB} \neq \infty$) or as not present ($Z_{1AB} \to \infty$). In FIG. 5 the extra link 55 between the terminals A, B having impedance for the positive sequence equal to: $Z_{1AB}$ can be considered as existing $$\left( Z_{1LB\&AB} = \frac{Z_{1LB} Z_{1AB}}{Z_{1LB} + Z_{1AB}} \right)$$

or as not present ($Z_{1LB\&AB} = Z_{1LB}$).

Substituting (6) into (4) and adjusting $a_{F0}=0$ (as in TABLE 2) results in:

$$\underline{V}_{AA\_p} - d Z_{1LA} I_{AA\_p} - \frac{R_F \underline{M}_1}{\underline{K}_1 d + \underline{L}_1}(a_{F1}\Delta \underline{I}_{AA1} + a_{F2} \underline{I}_{AA2}) = 0 \quad (7)$$

After multiplying both sides of (7) by:

$$\frac{\underline{K}_1 d + \underline{L}_1}{\underline{I}_{AA\_p}}$$

and some rearrangements, the quadratic formula with two unknowns, d-[p.u.] sought fault distance from A, $R_F$—fault resistance, is obtained:

$$\underline{K}_1 \underline{Z}_{1L} d^2 + (\underline{L}_1 \underline{Z}_{1L} - \underline{K}_1 \underline{Z}_{AA\_p})d - \underline{L}_1 \underline{Z}_{AA\_p} + R_F \underline{M}_1 \frac{(a_{F1}\Delta \underline{I}_{AA1} + a_{F2}\underline{I}_{AA2})}{\underline{I}_{AA\_p}} = 0. \quad (8)$$

where:

$$\underline{Z}_{AA\_p} = \frac{\underline{V}_{AA\_p}}{\underline{I}_{AA\_p}} - \text{calculated fault loop impedance.}$$

Writing formula (8) in more compact form results in:

$$\underline{A}_2 d^2 + \underline{A}_1 d + \underline{A}_0 + A_{00} R_F = 0 \quad (8a)$$

where:

$$\underline{A}_2 = A_{2\_Re} + j A_{2\_Im} = \underline{K}_1 \underline{Z}_{1LA}$$

$$\underline{A}_1 = A_{1\_Re} + j A_{1\_Im} = \underline{L}_1 \underline{Z}_{1LA} - \underline{K}_1 \underline{Z}_{AA\_p}$$

$$\underline{A}_0 = A_{0\_Re} + j A_{0\_Im} = -\underline{L}_1 \underline{Z}_{AA\_p}$$

$$A_{00\_Re} = j A_{oo\_Im} = \frac{\underline{M}_1(a_{F1}\Delta \underline{I}_{AA1} + a_{F2}\underline{I}_{AA2})}{\underline{I}_{AA\_p}}$$

$$\underline{Z}_{AA\_p} = \frac{\underline{V}_{AA\_p}}{\underline{I}_{AA\_p}}$$

calculated fault loop impedance $K_1$, $L_1$, $M_1$—coefficients gathered in TABLE 3.

Formula (8a) can be written separately for real and imaginary parts:

$$A_{2\_Re} d^2 + A_{1\_Re} d + A_{0\_Re} + A_{00\_Re} R_F = 0 \quad (8b)$$

$$A_{2\_Im} d^2 + A_{1\_Im} d + A_{0\_Im} + A_{00\_Im} R_F = 0 \quad (8c)$$

Combining (8b) and (8c) in such the way that fault resistance is eliminated [that is, equation (8b) is multiplied by $A_{00\_Im}$ and equation (8c) by $A_{00\_Re}$ and then subtracting them] yields the quadratic formula for a sought fault distance:

$$B_2 d^2 + B_1 d + B_0 = 0 \quad (9)$$

where:

$$B_2 = A_{2\_Re} A_{00\_Im} - A_{2\_Im} A_{00\_Re}$$

$$B_1 = A_{1\_Re} A_{00\_Im} - A_{1\_Im} A_{00\_Re}$$

$$B_0 = A_{0\_Re} A_{00\_Im} - A_{0\_Im} A_{00\_Re}$$

Equation (9) has two roots ($d_1$, $d_2$) for the distance to fault:

$$d_1 = \frac{-B_1 - \sqrt{B_1^2 - 4 B_2 B_0}}{2 B_2} \quad (10)$$

$$d_2 = \frac{-B_1 + \sqrt{B_1^2 - 4 B_2 B_0}}{2 B_2}$$

The root which fulfils the condition ($0 \leq d \leq 1$) is selected as the solution for the distance to fault.

In another embodiment of the invention, the method of fault location is carried out by using a measurement of source impedance at the second end remote from the fault locator 1, instead of a representative value for the source impedance at the remote end, and by communicating that measured value to the local end using a communication means. Coefficients from (9) are determined with the local measurements and the impedance data for the transmission line, the extra link between the line terminals and the equivalent systems at the line terminals. Impedance of the equivalent system at the local substation ($Z_{1sA}$) can be traced on-line with the local measurements. In contrast, the remote system impedance ($Z_{1sB}$) is not measurable locally from A. Thus, the "representative" value of this impedance may be provided for the algorithm [1-2].

Figure 6:
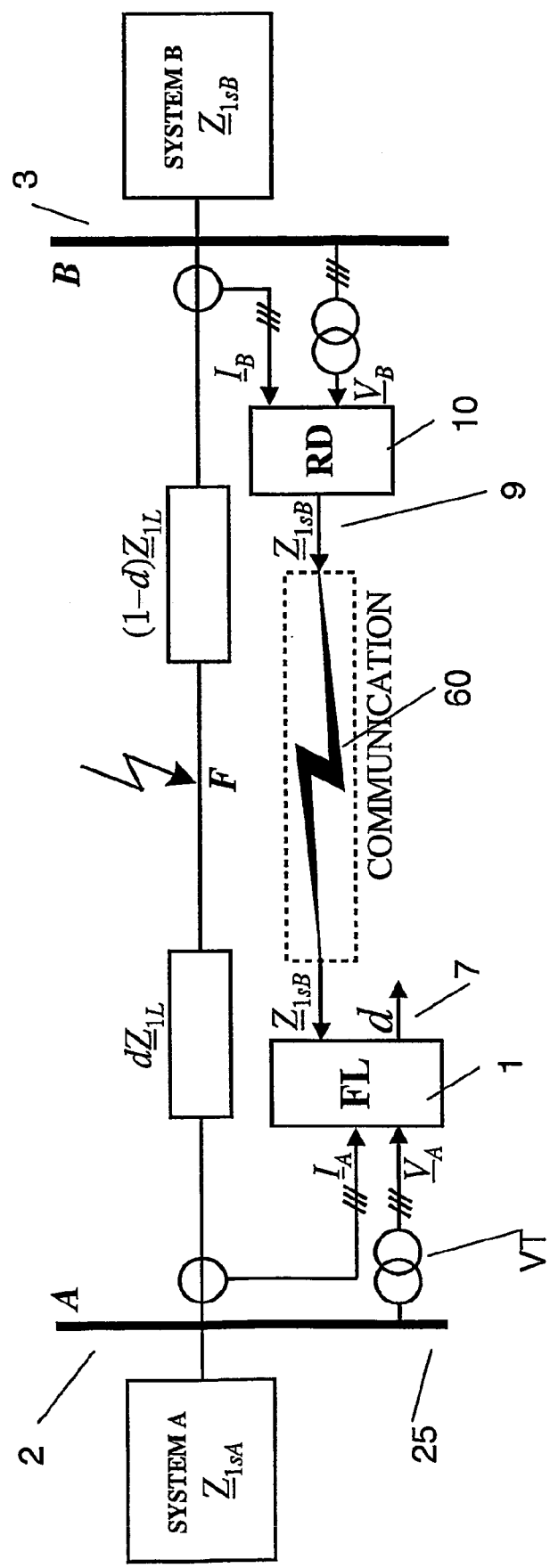
FIG. 6 shows a schematic diagram for an embodiment of the invention in which source impedance measured at a remote end B may be communicated to a fault locator at the first end A.

The alternative solution for the single line case is shown in FIG. 6, which shows a fault locator 1 at the first end 2 near to system A, and another device 10 located at the remote end 3 close to system B, indicated as RD. A communication signal 9 is shown being sent from the 10 at the remote end to the fault locator 1 at the local end.

The remote source impedance ($Z_{1sB}$) is measured by the remote device RD, 10, which may be another fault locator or any suitable device such as a digital relay or digital fault recorder, in the remote substation and the measurement 9 is sent via a communication channel 60. Synchronization of measurements at the line terminals is not required. The source impedance is calculated from the known relation between the incremental positive voltage ($\Delta V_{B1}$) and the incremental positive sequence current ($\Delta I_{B1}$) [3-4]:

$$\underline{Z}_{1sB} = -\frac{\Delta \underline{V}_{B1}}{\Delta \underline{I}_{B1}} \quad (11)$$

Similarly, the fault locator 1 calculates the local source impedance $$\underline{Z}_{1sA} = -\frac{\Delta \underline{V}_{A1}}{\Delta \underline{I}_{A1}} \quad (11a)$$

In another and preferred embodiment of the invention, compensation is carried out for the shunt capacitance of the line. Compensation for shunt capacitances effect can be accomplished by taking into account the lumped model (only the longitudinal $R$-$X_L$ parameters are taken into account) or the distributed long transmission line model. The distributed long line model [5] as providing higher accuracy of fault location, has been considered here.

The compensation for the single line is presented further. This means that when composing fault loop current (3) the term reflecting the mutual coupling effect disappears ($a_{0m}=0$). Moreover, the single subscript (A instead of AA) is used.

Fault location procedure with compensating for shunt capacitances of a transmission line requires the following additional input data:

$C_{1L}$—shunt capacitance of a whole line for the positive and the negative sequences (parameters of a line for the positive and the negative sequences are identical and thus: $C_{2L}=C_{1L}$)

$C_{0L}$—shunt capacitance of a whole line for the zero sequence, l—total line length (km), used for expressing impedances/capacitances of the line per km length.

The compensation of shunt capacitances may be introduced while determining the voltage drop across the faulted line segment—the second term in the generalized fault loop model (1). This requires compensating the components of the calculated currents for particular sequences. Thus, the original measured currents: $I_{A1}$, $I_{A2}$, $I_{A0}$ have to be replaced by the currents after the introduced compensation: $I_{A1\_comp}$, $I_{A2\_comp}$, $I_{A0\_comp}$. At the same time the original fault loop voltage, the first term in the model (1), is taken for a distance to fault calculation. As concerns determining the voltage drop across the fault resistance, the third term in (1), it is assumed here, which is a standard practice, that the effect of line capacitances at the location of the fault (point F), may be neglected. This is justified as the impedance of the capacitive branch at that location is much greater than the fault resistance. This means that the voltage drop across the fault resistance is determined without taking into account the shunt capacitances.

Calculating a distance to fault the following impedances (defined below) are taken as:

$Z_{1L}^{long}$—positive sequence impedance of a line with taking into account the distributed long line model, $Z_{0L}^{long}$—as above, but for the zero sequence.

The compensation procedure requires iterative calculations, performed until the convergence is achieved (i.e. iterated until the location estimate ceases to differ from the previous estimate). However, the studies conducted revealed that results of acceptable accuracy may be obtained using a fixed number of iterations, for example, 2-3 iterations. The calculated distance to a fault from a particular (say, present iteration) is utilized for determining the shunt current in the next iteration. The determined shunt current is then deduced from the measured current. A distance to fault, calculated without considering the shunt effect (10), is taken as the starting value for the first iteration.

Figure 7:
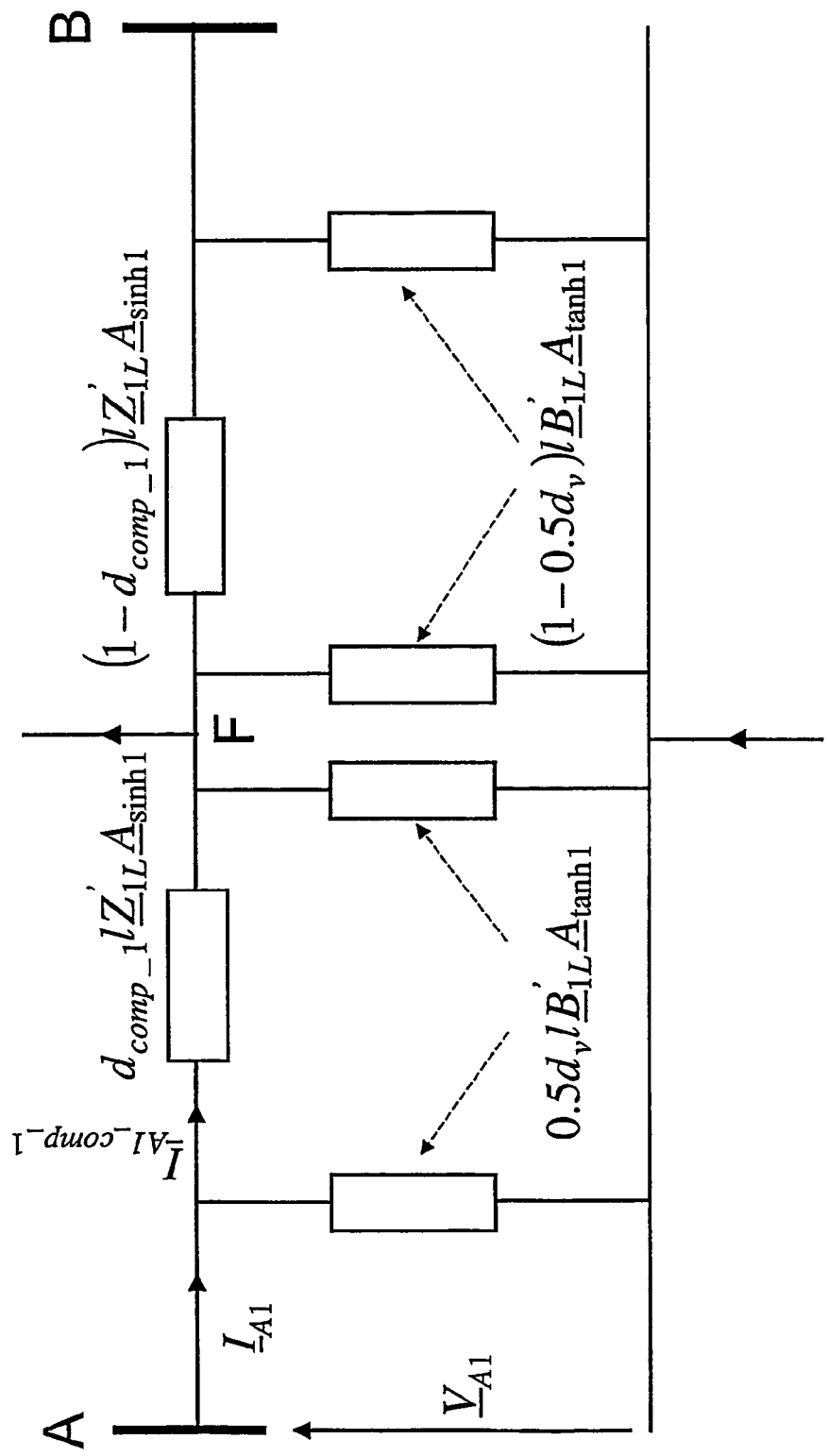
FIG. 7 is a circuit diagram of an embodiment in which the shunt capacitances are taken into account, and shows a positive sequence circuit diagram during a first iteration.
Figure 8:
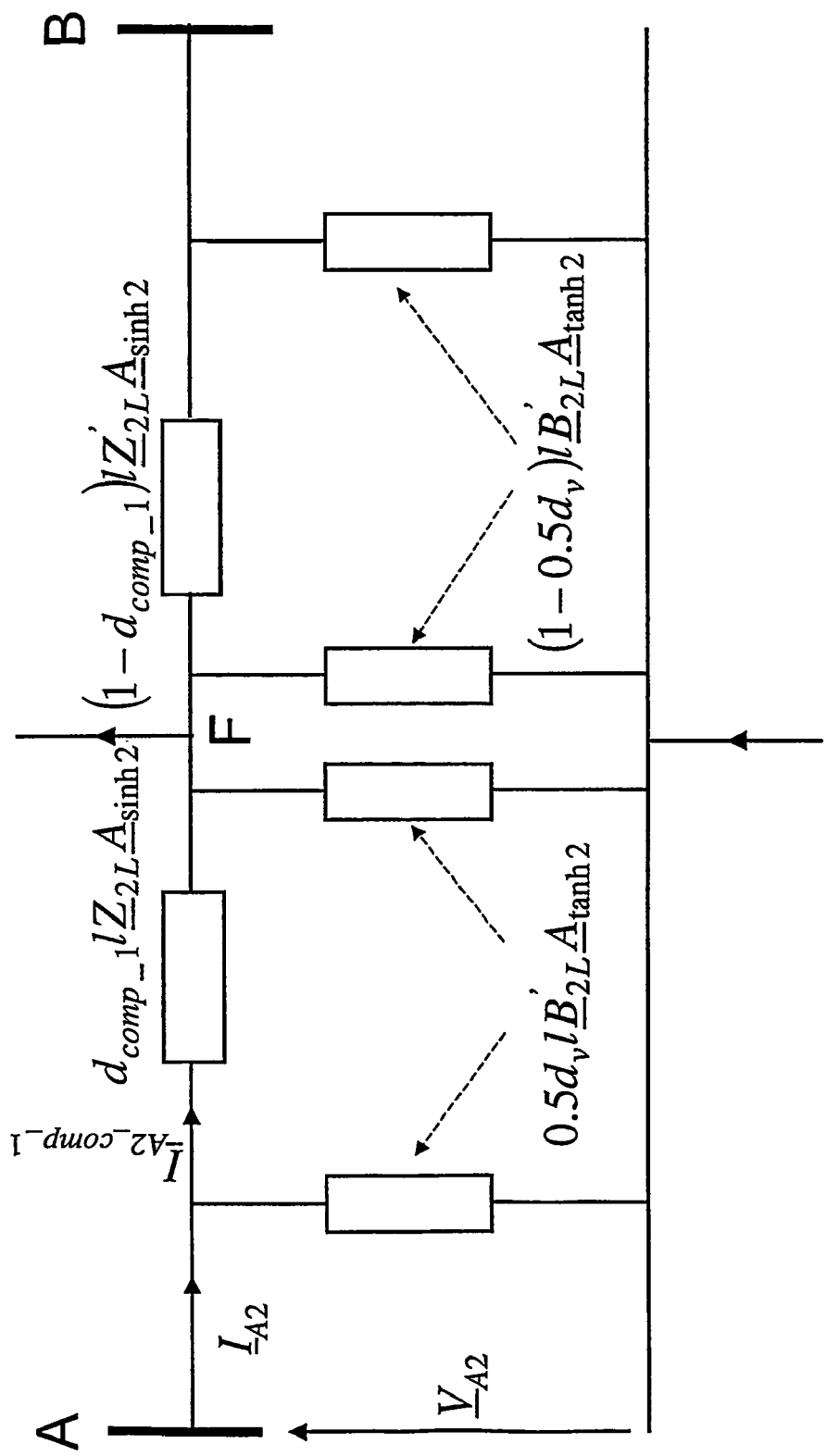
FIG. 8 shows a negative sequence circuit diagram for taking the shunt capacitances effect into account during a first iteration.
Figure 9:
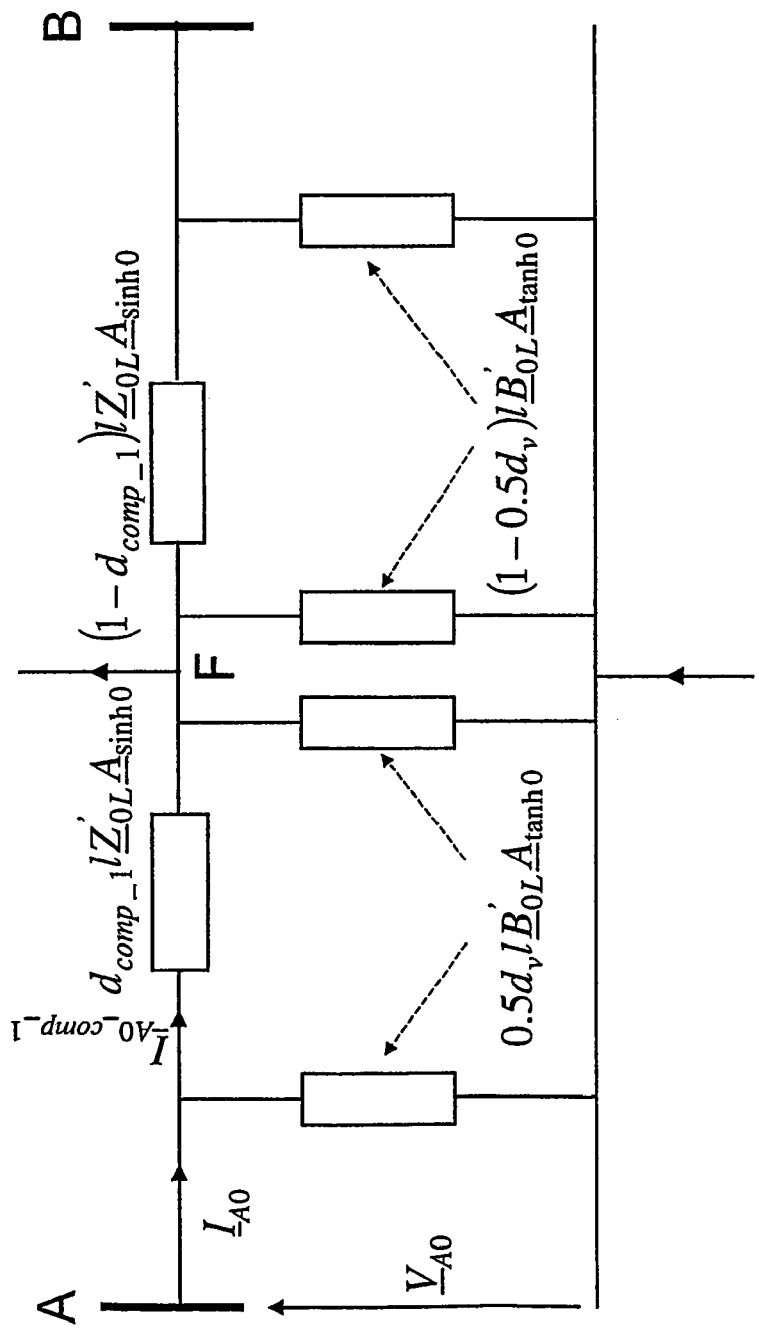
FIG. 9 shows a zero sequence circuit diagram for taking the shunt capacitances effect into account during a first iteration.

A way of conducting the first iteration of the compensation is shown in FIGS. 7, 8, 9 for the positive sequence, negative sequence and zero sequence respectively with taking into account the shunt capacitances effect.

Figure 2B:
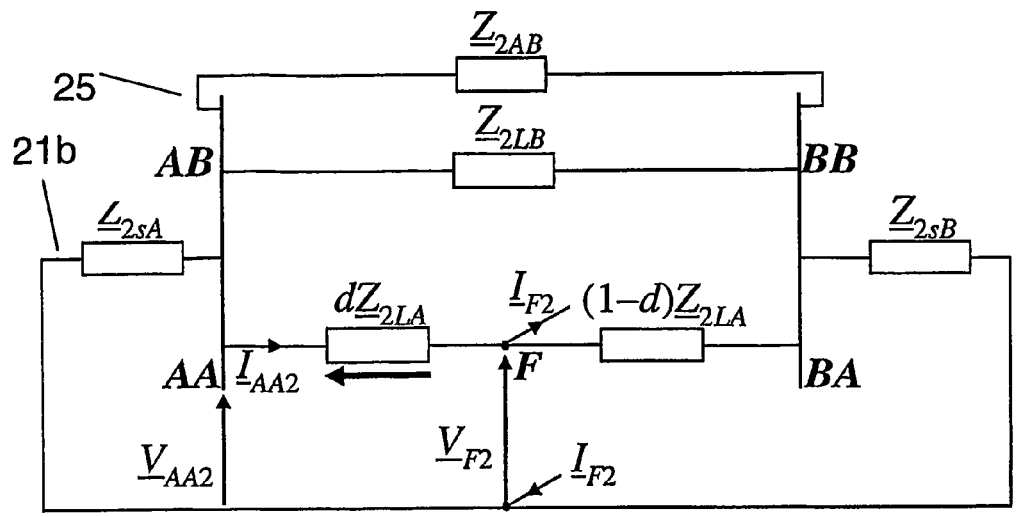
FIGS. 2b, 2c show corresponding diagrams for the negative sequence and zero sequence components, respectively.
Figure 2C:
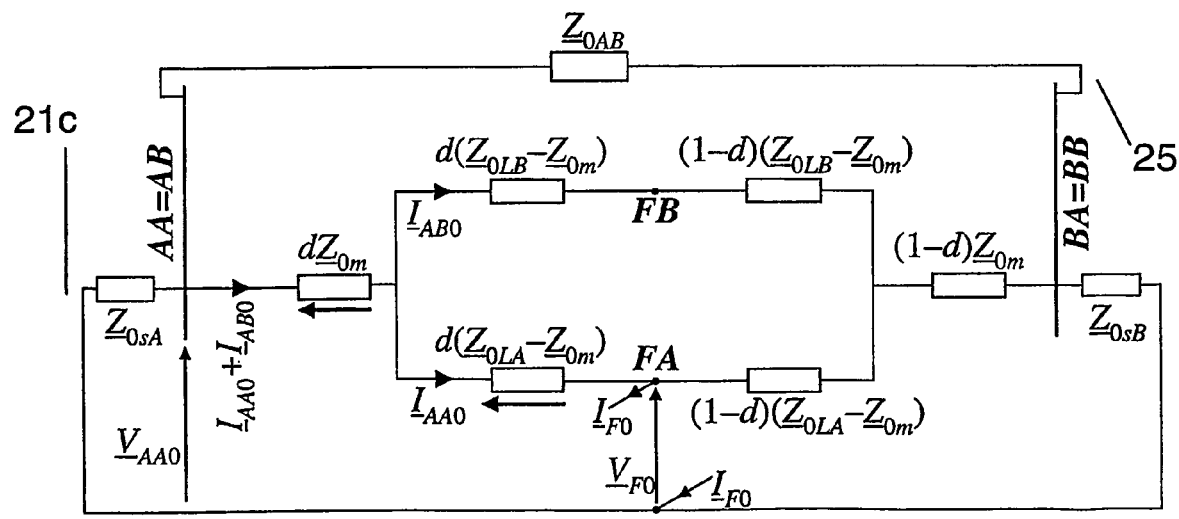

As a result of performing the first iteration for the positive sequence (FIG. 7) the compensated current $I_{A1\_comp\_1}$ is calculated and the last index in the subscript denotes the first iteration. The calculation is based on deducing the shunt current from the calculated positive sequence current $I_{A1}$ calculated from the measured phase currents—FIG. 2:

$$I_{A1\_comp\_1} = I_{A1} - 0.5 d_v l B'_{1L} A_{tanh\,1} V_{A1} \quad (12)$$

where:

$d_v$—distance to fault calculated without taking into account the shunt capacitance effect (10), l—total line length (km)

$$A_{tanh\,1} = \frac{\tanh\left(\sqrt{0.5 Z'_{1L} B'_{1L}}\, d_v l\right)}{\sqrt{0.5 Z'_{1L} B'_{1L}}\, d_v l}$$

$$B'_{1L} = \frac{j\omega C_{1L}}{l}$$

positive sequence admittance (capacitive) of a line per km length (S/km)

$$Z'_{1L} = \frac{Z_{1L}}{l}$$

positive sequence impedance of a line per km length ($\Omega$/km)

Positive sequence impedance of a faulted line segment, between points A and F, without taking into account the shunt capacitances effect and considering the lumped line model equals:

$$d_v l Z'_{1L} \quad (13)$$

while for the considered here distributed long line model:

$$d_v l Z'_{1L} A_{sinh\,1} \quad (14)$$

where:

$$A_{sinh\,1} = \frac{\sinh\left(\sqrt{Z'_{1L} B'_{1L}}\, d_v l\right)}{\sqrt{Z'_{1L} B'_{1L}}\, d_v l}$$

Thus, the positive sequence impedance of a line with taking into account the distributed long line model ($Z_{1L}^{long}$) equals:

$$Z_{1L}^{long} = A_{sinh\,1} Z_{1L} \quad (15)$$

As a result of performing the first iteration for the negative sequence (FIG. 8) the compensated current $I_{A2\_comp\_1}$ is calculated and the last index in the subscript denotes the first iteration. This is based on deducing the shunt current from the calculated negative sequence current $I_{A2}$, calculated from the measured phase currents—FIG. 2):

$$I_{A2\_comp\_1} = I_{A2} - 0.5 d_v l B'_{2L} A_{tanh\,2} V_{A2} \quad (16)$$

where, taking into account that the line parameters for the positive and for the negative sequences are identical ($C_{2L}=C_{1L}$, $Z_{2L}=Z_{1L}$):

$$A_{tanh\,2} = A_{tanh\,1}$$

$$B'_{2L} = B'_{1L}$$

As a result of performing the first iteration for the zero sequence (FIG. 9) the compensated current $I_{A0\_comp\_1}$ is calculated, last index in the subscript denotes the first iteration. This calculation is based on deducing the shunt current from the calculated zero sequence current $I_{A0}$, calculated from the measured phase currents—FIG. 2:

$$I_{A0\_comp\_1} = I_{A0} - 0.5 d_v l B'_{0L} A_{tanh\,0} V_{A0} \quad (17)$$

where:

$$A_{tanh0} = \frac{\tanh(\sqrt{0.5 Z'_{0L} B'_{0L}}\, d_v l)}{\sqrt{0.5 Z'_{0L} B'_{0L}}\, d_v l}$$

$$B'_{0L} = \frac{j\omega C_{0L}}{l}$$

zero sequence admittance (capacitive) of a line per km length (S/km)

$$Z'_{0L} = \frac{Z_{0L}}{l}$$

zero sequence impedance of a line per km length (Ω/km)

Zero sequence impedance of a faulted line segment, that is between points A and F, without taking into account the shunt capacitances effect and considering the lumped line model equals:

$$d_v l Z'_{0L} \quad (18)$$

while for the considered here distributed long line model:

$$d_v l Z'_{0L} A_{sinh\,0} \quad (19)$$

where:

$$A_{sinh0} = \frac{\sinh(\sqrt{Z'_{0L} B'_{0L}}\, d_v l)}{\sqrt{Z'_{0L} B'_{0L}}\, d_v l}$$

Thus, the zero sequence impedance of a line with taking into account the distributed long line model ($Z_{0L}^{long}$) equals:

$$Z_{0L}^{long} = A_{sinh\,0} Z_{0L} \quad (20)$$

The quadratic complex formula (8) with two unknowns ($d_{comp\_1}$ [p.u.]—sought fault distance, $R_F$—fault resistance) after introducing the compensation (first iteration) takes the following form:

$$\underline{K}_1 \underline{Z}_{1L}^{long}(d_{comp\_1})^2 + (\underline{L}_1 \underline{Z}_{1L}^{long} - \underline{K}_1 \underline{Z}_{A\_p}^{comp\_1})d_{comp\_1} - \underline{L}_1 \underline{Z}_{A\_p}^{comp\_1} + R_F \underline{M}_1 \frac{(a_{F1}\Delta\underline{I}_{AA1} + a_{F2}\underline{I}_{AA2})}{\underline{I}_{A\_p}^{comp\_1}} = 0 \quad (21)$$

where:

$$\underline{Z}_{1L}^{long} = \underline{A}_{sinh1} \underline{Z}_{1L},$$

$$\underline{A}_{sinh1} = \frac{\sinh(\sqrt{\underline{Z}'_{1L} \underline{B}'_{1L}}\, d_v l)}{\sqrt{\underline{Z}'_{1L} \underline{B}'_{1L}}\, d_v l},$$

$$\underline{Z}_{A\_p}^{comp\_1} = \frac{\underline{V}_{A\_p}}{\underline{I}_{A\_p}^{comp\_1}}$$

fault loop impedance calculated with:

$V_{A\_p}$—original fault loop voltage (2), $I_{A\_p}^{comp\_1} = a_1 I_{A1\_comp\_1} + a_2 I_{A2\_comp\_1} + a_0 I_{A0\_comp\_1}$—fault loop current composed of the positive (12), negative (16) and zero (17) sequence currents obtained after deducing the respective capacitive currents from the original currents.

Writing (21) in a more compact form results in:

$$\underline{A}_2^{comp\_1}(d_{comp\_1})^2 + \underline{A}_1^{comp\_1} d_{comp\_1} + \underline{A}_0^{comp\_1} + \underline{A}_{00}^{comp\_1} R_F = 0 \quad (21a)$$

where:

$$\underline{A}_2^{comp\_1} = A_{2\_Re}^{comp\_1} + jA_{2\_Im}^{comp\_1} = \underline{K}_1 \underline{Z}_{1L}^{long}$$

$$\underline{A}_1^{comp\_1} = A_{1\_Re}^{comp\_1} + jA_{1\_Im}^{comp\_1} = \underline{L}_1 \underline{Z}_{1L}^{long} - \underline{K}_1 \underline{Z}_{A\_p}^{comp\_1}$$

$$\underline{A}_0^{comp\_1} = A_{0\_Re}^{comp\_1} + jA_{0\_Im}^{comp\_1} = -\underline{L}_1 \underline{Z}_{A\_p}^{comp\_1}$$

$$\underline{A}_{00}^{comp\_1} = A_{00\_Re}^{comp\_1} + jA_{00\_Im}^{comp\_1} = \frac{\underline{M}_1(a_{F1}\Delta\underline{I}_{AA1} + a_{F2}\underline{I}_{AA2})}{\underline{I}_{A\_p}^{comp\_1}}$$

$$\underline{Z}_{A\_p}^{comp\_1} = \frac{\underline{V}_{A\_p}}{\underline{I}_{A\_p}^{comp\_1}}$$

fault loop impedance calculated with:

$V_{A\_p}$—original (uncompensated) fault loop voltage (2), $I_{A\_p}^{comp\_1} = a_1 I_{A1\_comp\_1} + a_2 I_{A2\_comp\_1} + a_0 I_{A0\_comp\_1}$—fault loop current composed of the positive (12), negative (16) and zero (17) sequence currents obtained after deducing the respective capacitive currents from the original currents, $K_1$, $L_1$, $M_1$—coefficients gathered in TABLE 3.

Formula (21a) can be written down separately for real and imaginary parts:

$$A_{2\_Re}^{comp\_1}(d_{comp\_1})^2 + A_{1\_Re}^{comp\_1} d_{comp\_1} + A_{0\_Re}^{comp\_1} + A_{00\_Re}^{comp\_1} R_F = 0 \quad (21b)$$

$$A_{2\_Im}^{comp\_1}(d_{comp\_1})^2 + A_{1\_Im}^{comp\_1} d_{comp\_1} + A_{0\_Im}^{comp\_1} + A_{00\_Im}^{comp\_1} R_F = 0 \quad (21c)$$

Combining (21b) and (21c) in such the way that fault resistance is eliminated, that is, equation (21b) is multiplied by $A_{00\_Im}^{comp\_1}$ and equation (21c) by $A_{00\_Re}^{comp\_1}$ and then subtracting them, yields the quadratic formula for a sought fault distance:

$$B_2^{comp\_1}(d_{comp\_1})^2 + B_1^{comp\_1} d_{comp\_1} + B_0^{comp\_1} = 0 \quad (22)$$

where:

$$B_2^{comp\_1} = A_{2\_Re}^{comp\_1} A_{00\_Im}^{comp\_1} - A_{2\_Im}^{comp\_1} A_{00\_Re}^{comp\_1}$$

$$B_1^{comp\_1} = A_{1\_Re}^{comp\_1} A_{00\_Im}^{comp\_1} - A_{1\_Im}^{comp\_1} A_{00\_Re}^{comp\_1}$$

$$B_0^{comp\_1} = A_{0\_Re}^{comp\_1} A_{00\_Im}^{comp\_1} - A_{0\_Im}^{comp\_1} A_{00\_Re}^{comp\_1}$$

Equation (22) has two roots [$(d_{comp\_1})_1$, $(d_{comp\_1})_2$] for the distance to fault:

$$(d_{comp\_1})_1 = \frac{-B_1^{comp\_1} - \sqrt{(B_1^{comp\_1})^2 - 4B_2^{comp\_1} B_0^{comp\_1}}}{2B_2^{comp\_1}} \quad (23)$$

$$(d_{comp\_1})_2 = \frac{-B_1^{comp\_1} + \sqrt{(B_1^{comp\_1})^2 - 4B_2^{comp\_1} B_0^{comp\_1}}}{2B_2^{comp\_1}}$$

The root, which corresponds to the selected previously root (10) for d (uncompensated) is taken as the valid result. The compensation procedure requires iterative calculations, performed until the convergence is achieved (i.e. until the location estimates cease to change from the previous estimates) or as with a fixed number of iterations such as 2-3 iterations. The calculated distance to a fault from a particular (say, present iteration) is utilized for determining the shunt current in the next iteration.

Figure 10:
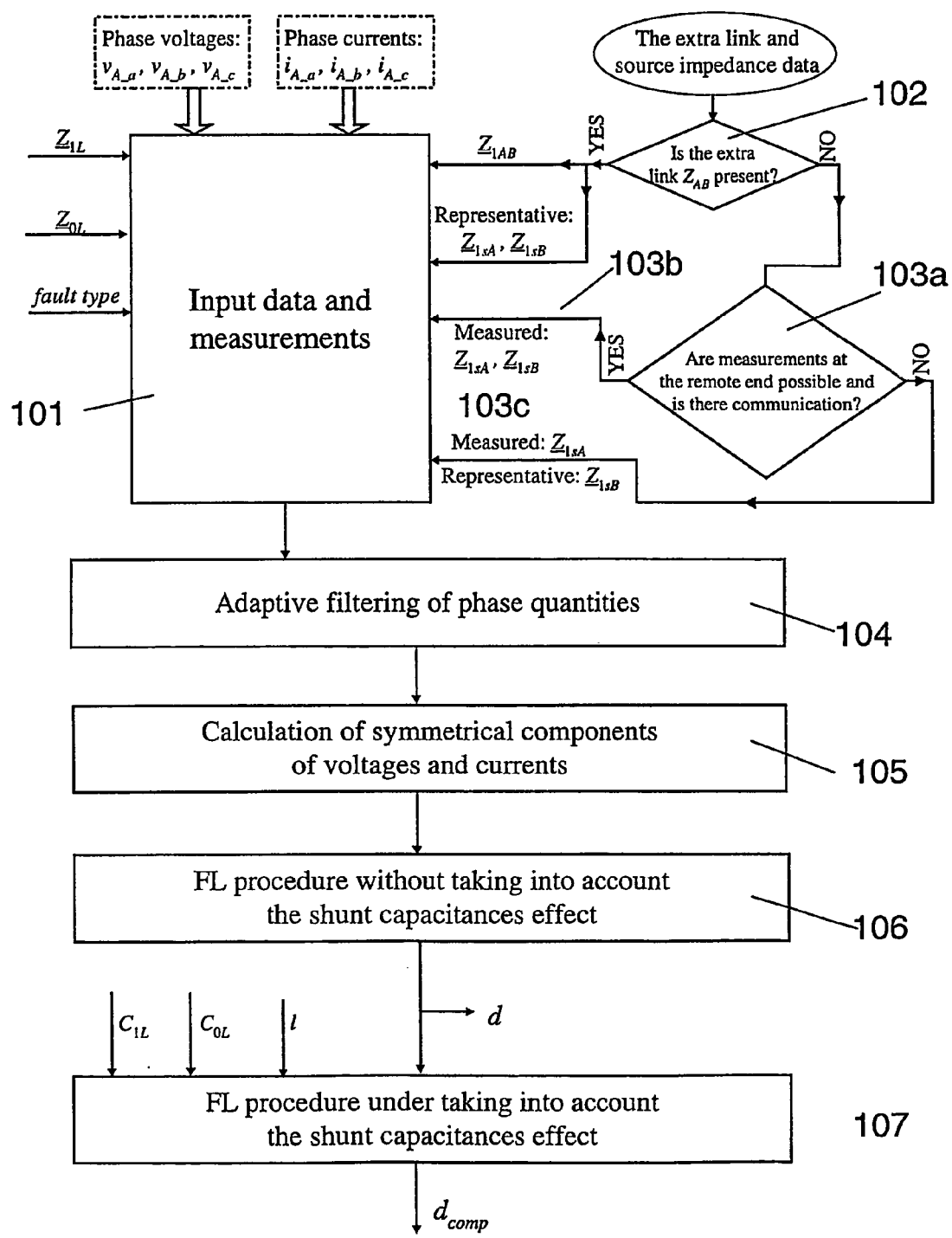
FIG. 10 shows a flowchart for a method for locating a fault in a single line according to an embodiment of the invention.
Figure 11:
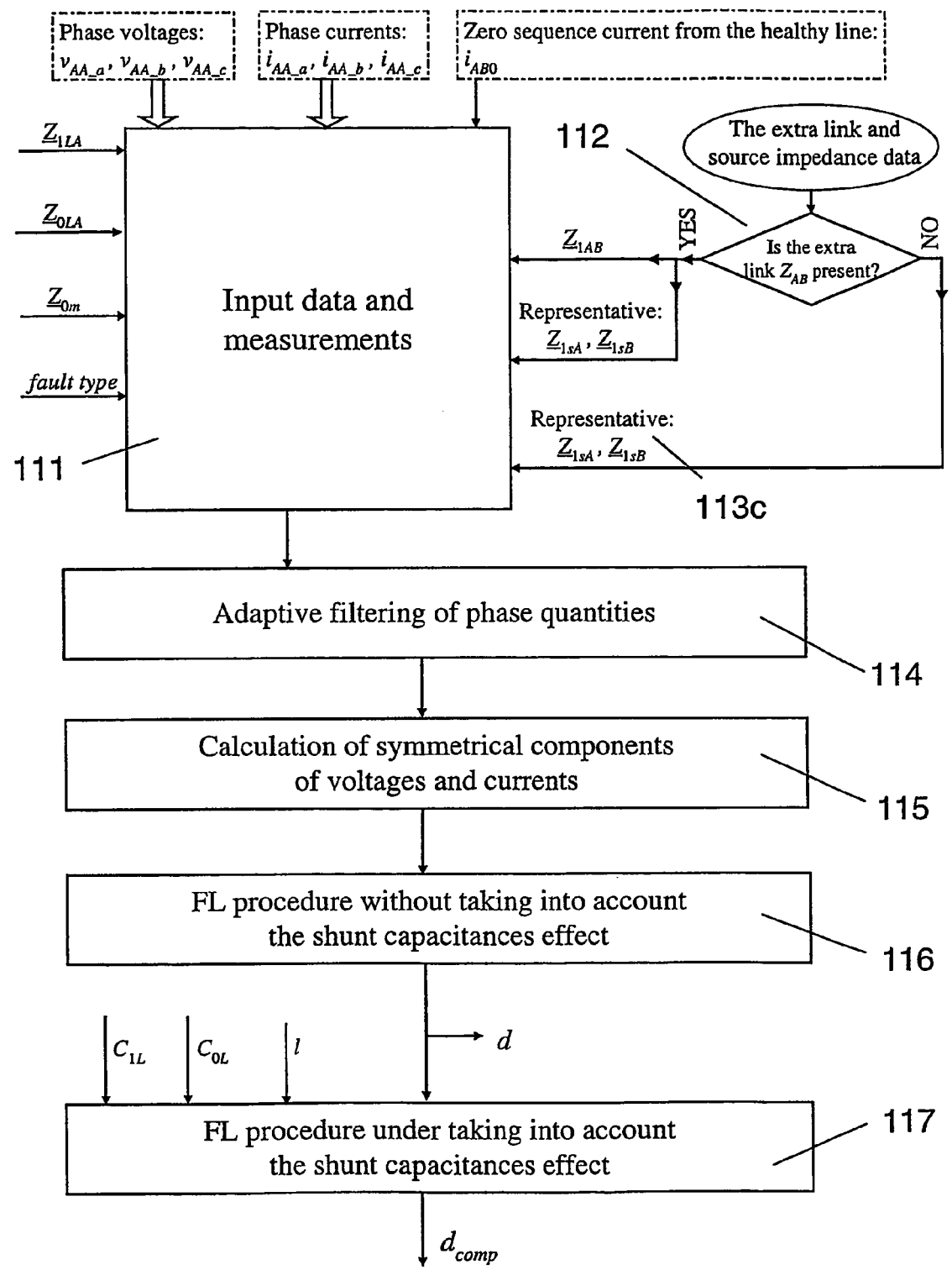
FIG. 11 shows a flowchart for a method for locating a fault in parallel lines according to an embodiment of the invention.

The method of the invention is illustrated in two flowcharts of the FL algorithm, FIG. 10, single line and in FIG. 11, parallel lines.

As shown in the flowchart in FIG. 10 the following measurements are utilized:
  voltages from the side A from particular phases a, b, c:
    $v_{A\_a}$, $v_{A\_b}$, $v_{A\_c}$
  currents from the side A from particular phases a, b, c:
    $i_{A\_a}$, $i_{A\_b}$, $i_{A\_c}$ The input data utilized at step 101, Input data and measurements, are as follows:
  impedances of the line for the positive ($Z_{1L}$) and zero ($Z_{0L}$) sequences,
  impedance of the extra link 25, 45, 55 between the substations A, B for the positive (negative) sequences ($Z_{1AB}$)
  source impedances for the positive (negative) sequences ($Z_{1sA}$, $Z_{1sB}$): the representative values or the measured values are used, and a communication means is used for sending the measured remote source impedance as previously described,
  information on the fault type (from the protective relay).

The measured fault quantities (voltages and currents) undergo adaptive filtering at step 104, Adaptive filtering of phase quantities, aimed at rejecting the dc components from currents and the transients induced by Capacitive Voltage Transformers (CVTs).

In the next step the symmetrical components of voltages and currents are calculated, step 105, which is equivalent to that as shown in FIGS. 3a, 3b. The fault loop signals are composed: the fault loop voltage as in (2), while the fault loop current as in (3)—but with taking $a_{0m}=0$.

The distance to fault without taking into account the shunt capacitances effect (d) is calculated at step 106 by solving the quadratic formula (9). The solution of (9) is presented in (10).

The result obtained without taking into account the shunt capacitances effect d following 106 is treated as the starting value for performing the compensation for shunt capacitances. The distributed long line model is applied for the compensation.

The following additional data is required for the calculating the compensation for shunt capacitance, step 107:
  positive sequence capacitance of the line ($C_{1L}$)
  zero sequence capacitance of the line ($C_{0L}$)
  line length (l), which is used to express line impedances/capacitances per km length.

The first iteration of the compensation leads to the quadratic equation (22), which is solved in (23). The next iterations are performed analogously. Iterative calculations are performed until the convergence is achieved or a fixed number of iterations, i.e. 2-3 iterations, may be made. The calculated distance to a fault from a particular (say, present iteration) is utilized for determining the shunt current in the next iteration. After completing the iterative calculations the distance to fault $d_{comp}$ is obtained.

As shown in the flowchart in FIG. 11 for parallel lines the following measurements are utilized:
  voltages from the side A and line LA from particular phases a, b, c: $v_{AA\_a}$, $v_{AA\_b}$, $v_{AA\_c}$
  currents from the side A and line LA from particular phases a, b, c: $i_{AA\_a}$, $i_{AA\_b}$, $i_{AA\_c}$
  zero sequence current from the healthy parallel line LB:
    $i_{AB0}$ The input data utilized in step 111, Input data and measurements, are as follows:
  impedances of the faulted line for the positive ($Z_{1LA}$) and zero ($Z_{0LA}$) sequences
  impedance of the healthy line for the positive (negative) sequence ($Z_{1LB}$)
  impedance of the extra link between the substations A, B for the positive (negative) sequences ($Z_{1AB}$)
  zero sequence impedance for the mutual coupling ($Z_{0m}$)
  representative values of the source impedances for the positive (negative) sequences ($Z_{1sA}$, $Z_{1sB}$)
  information on the fault type is obtained from the protective relay.

The measured fault quantities, the voltages and currents, undergo adaptive filtering at step 114 for the purpose of rejecting the dc components from currents and the transients induced by Capacitive Voltage Transformers (CVTs).

In the next step 115 the symmetrical components of voltages and currents are calculated as shown in FIGS. 3a, 3b. The fault loop signals are composed: the fault loop voltage as in (2), while the fault loop current as in (3)—but with taking $a_{0m}=a_0$.

The distance to fault without taking into account the shunt capacitances effect (d) is calculated in step 116 by solving the quadratic formula (9). The solution of (9) is presented in (10)

The result obtained without taking into account the shunt capacitances effect (d) is treated as the starting value for performing the compensation for shunt capacitances. The distributed long line model is applied for the compensation.

The following additional data for the faulted line is required for the compensation for shunt capacitances step 117:
  positive sequence capacitance of the line ($C_{1L}$)
  zero sequence capacitance of the line ($C_{0L}$)
  line length (l), which is used to express line impedances/capacitances per km length.

In the case of a single line, the compensation is performed analogously. Iterative calculations are performed until the convergence is achieved or by using a fixed number of iterations, e.g. 2-3 iterations. The calculated distance to a fault from a particular iteration, for example the present iteration, is utilized for determining the shunt current in the next iteration. After completing the iterative calculations the distance to fault $d_{comp}$ is obtained.

Figure 18:
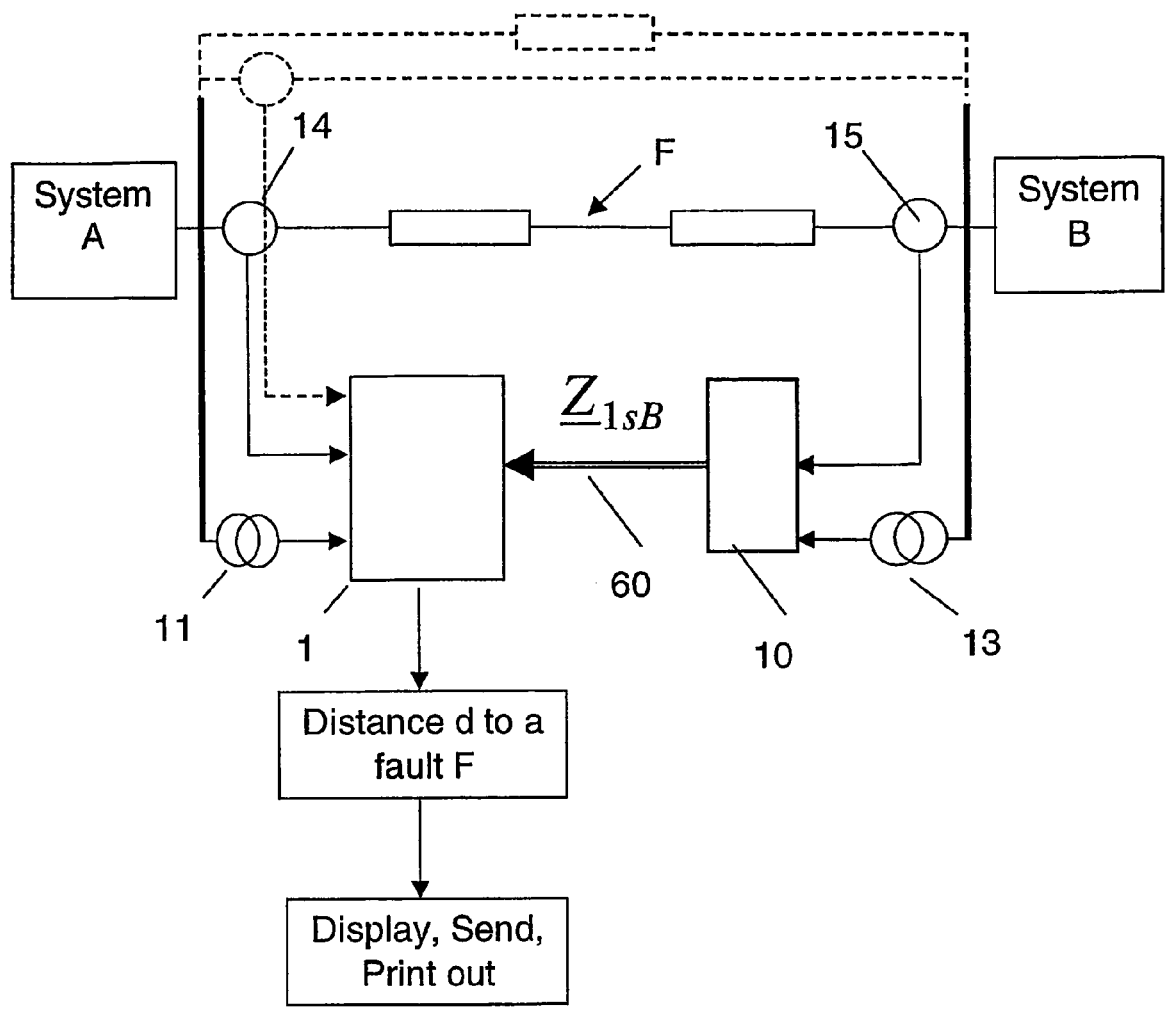
FIG. 18 shows a fault locator device and system according to an embodiment of the invention.

FIG. 18 shows an embodiment of a device for determining the distance from one end, here shown as end A of a section of power transmission or distribution line A-B, to a fault F on the power line according to the method of the invention described. The fault locator device 1 receives measurements from measuring devices located at one end A such as current measuring means 14, and voltage measurements from voltage measurement means 11. The fault locator device may comprise measurement value converters, members for treatment of the calculating algorithms of the method, indicating means for the calculated distance to fault and a printer or connection to a printer or facsimile machine or similar for printout of the calculated fault. In a preferred embodiment of the device the fault locator comprises computer program means for providing a display of the information provided by the method of the invention, such as distance to a fault d or $d_{comp}$ on a terminal which may be remote from the location of the line and/or the fault locator. Preferably the computer program means receives information from the fault locator and makes it available to provide information for a display of a computer such that an operator or engineer may see a value for the calculated distance to a fault displayed. The value may be displayed relative to a schematic display of the line or network in which the fault has taken place.

In the embodiment shown, measuring device 14 for continuous measurement of all the phase currents, and measuring device 11 for measurement of voltages are arranged at one end, station A. Optionally, measuring devices such as 15, 13 may also be arranged at station B but they are not necessary to practise the invention. The measured values such as: the three-phase voltages ($V_{AA}$) of the faulted line, three-phase voltages ($I_{AA}$) of the faulted line and zero sequence current ($I_{AB0}$) from the healthy parallel line (note that zero sequence is not present when the single line only is considered), and a value representative of the source impedance at B, $Z_{1sB}$ as a are all passed to a calculating unit comprised in fault locator 1, filtered such as described in relation to FIGS. 3a, 3b, and stored in memory means. The calculating unit is provided with the calculating algorithms described, and programmed for the processes needed for calculating the distance to fault. Optionally, the source impedance for the remote end, $Z_{1sB}$ may be measured by the remote device RD, 10, and the information sent via a high speed communication means 60 to the fault locator at A. In some applications it will be preferable to use a measured value sent from B instead of a representative value stored at A. It may be seen in FIG. 18 that current measuring means 15 and voltage measuring means 13 at remote end B may provide a RD 10, a fault locator, or any suitable device with measurements to calculate the remote source impedance The calculating unit of fault locator 1 is provided with pre-fault phase currents and also with known values such as shunt capacitances and the impedances of the line. In respect of the occurrence of a fault, information regarding the type of fault, phase-to-phase, phase-to-ground etc., may be supplied to the calculating unit of the fault locator. When the calculating unit has determined the distance to fault, it is displayed on the device and/or sent to display means which may be remotely located. A printout or fax of the result may also be provided. In addition to signalling the fault distance, the device can produce reports, in which are recorded measured values of the currents of both lines, voltages, type of fault and other measured and/or calculated information associated with a given fault at a distance.

The method and a fault locator device according to any embodiment of the invention may be used to determine distance to a fault on a section of power transmission line. The present invention may also be used to determine a distance to a fault on a section of a power distribution line, or any other line or bus arranged for any of generation, transmission, distribution, control or consumption of electrical power.

The fault locator device and system may comprise filters for filtering the signals, converters for sampling the signals and one or more micro computers. The microprocessor (or processors) comprises a central processing unit CPU performing the steps of the method according to the invention. This is performed with the aid of a computer program, which is stored in the program memory. It is to be understood that the computer program may also be run on one or more general purpose industrial computers or microprocessors instead of a specially adapted computer.

The computer program comprises computer program code elements or software code portions that make the computer perform the method using equations, algorithms, data and calculations previously described. A part of the program may be stored in a processor as above, but also in a ROM, RAM, PROM or EPROM chip or similar. The program in part or in whole may also be stored on, or in, other suitable computer readable medium such as a magnetic disk, CD-ROM or DVD disk, hard disk, magneto-optical memory storage means, in volatile memory, in flash memory, as firmware, or stored on a data server.

A computer program according to the invention may be stored at least in part on different mediums that are computer readable. Archive copies may be stored on standard magnetic disks, hard drives, CD or DVD disks, or magnetic tape. The databases and libraries are stored preferably on one or more local or remote data servers, but the computer program and/or computer program product may, for example at different times, be stored in any of; a volatile Random Access memory (RAM) of a computer or processor, a hard drive, an optical or magneto-optical drive, or in a type of non-volatile memory such as a ROM, PROM, or EPROM device. The computer program may also be arranged in part as a distributed application capable of running on several different computers or computer systems at more or less the same time.

In another preferred embodiment, the fault locator may be used with parallel lines to locate single phase-to-ground faults (a-g, b-g, c-g faults) in case of unavailability of measurements from the healthy parallel line. Two modes of the healthy line operation are taken into account:
the healthy line being in operation,
the healthy line switched-off and grounded at both the ends.

Figure 19:
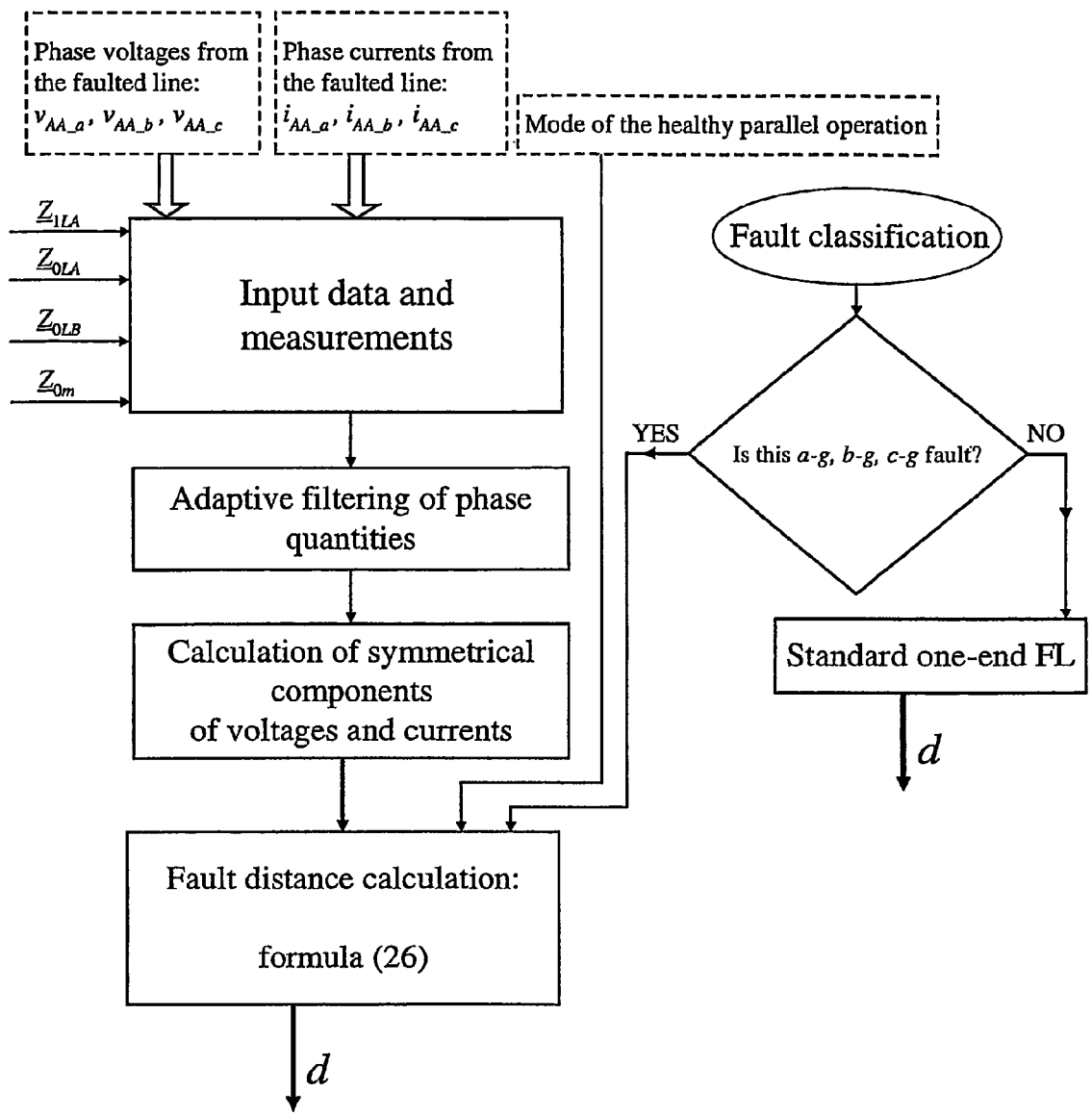
FIG. 19 shows a flowchart for a method for locating a single phase-to-ground fault in parallel lines in the case of measurements from the healthy line being unavailable, according to an embodiment of the invention.
Figure 20:
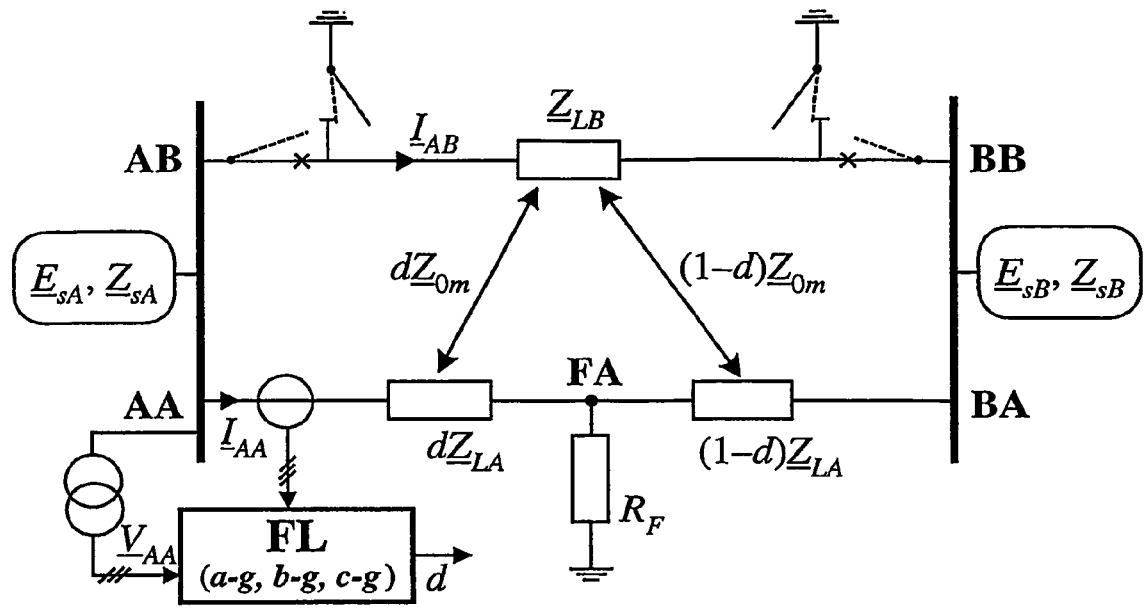
FIG. 20 shows a schematic diagram for a method of fault location for parallel lines with different modes of the healthy parallel operation.
Figure 21A:
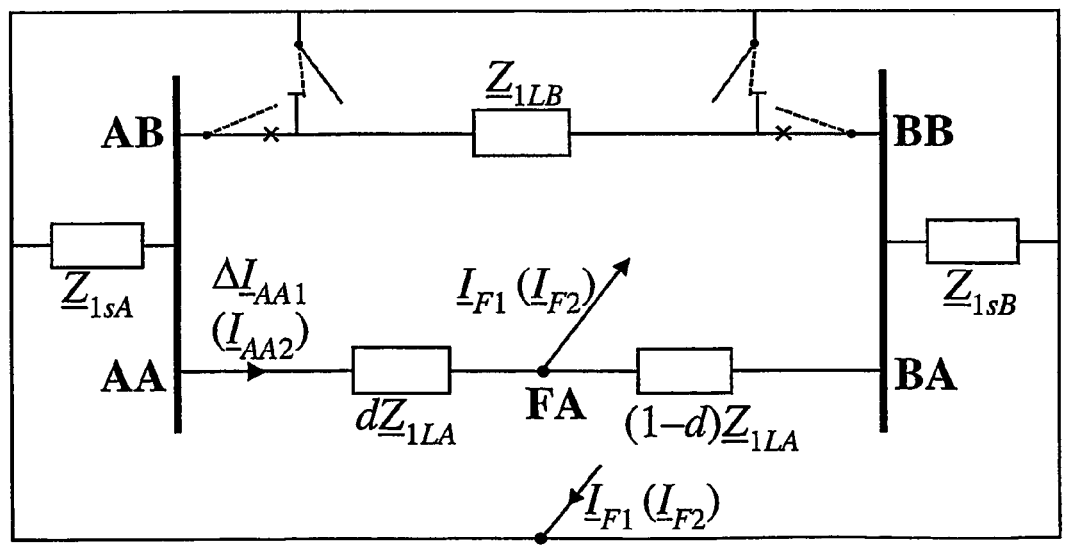
FIG. 21a, shows a schematic equivalent circuit diagram for a parallel network for the incremental positive or the negative sequence.
Figure 21B:
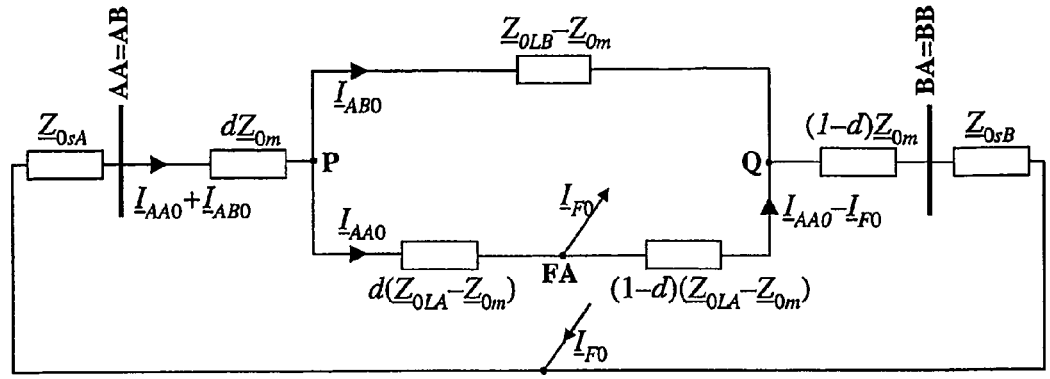
FIG. 21b shows an equivalent circuit diagram for the zero sequence while both parallel lines are in operation.
Figure 21C:
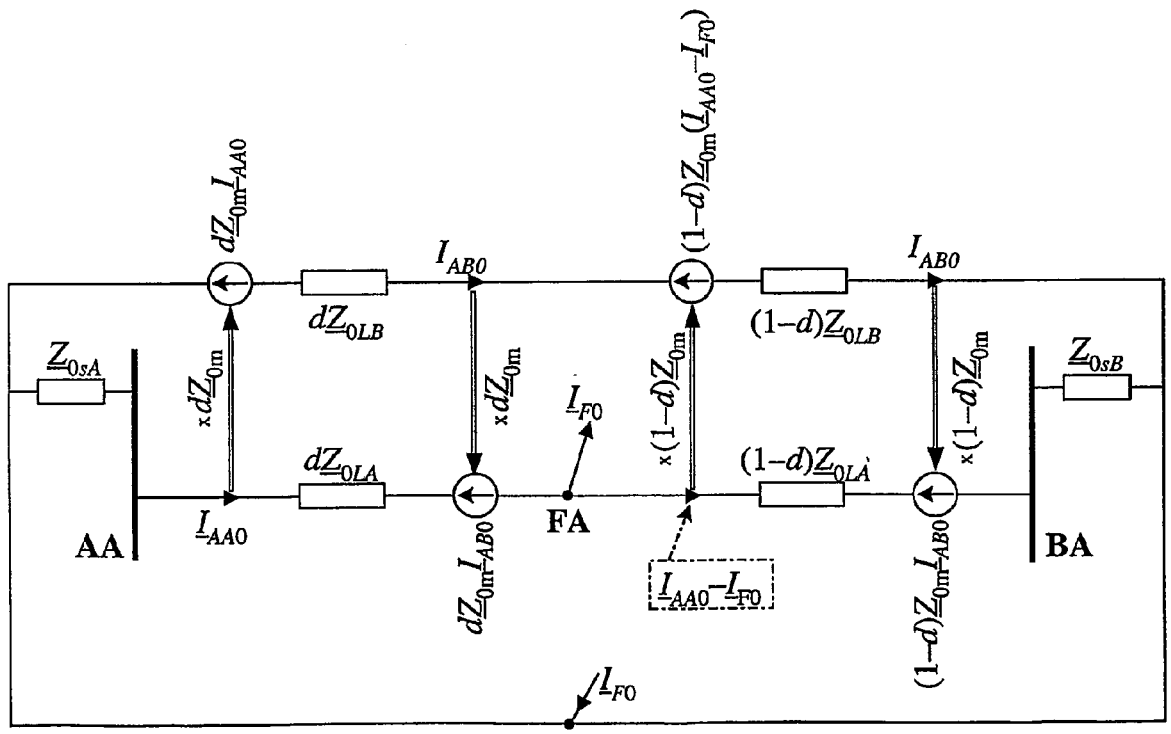
FIG. 21c shows the equivalent circuit diagram for the zero sequence with the healthy parallel line switched off and grounded.

FIG. 19 shows the flow-chart of the algorithm for locating faults in parallel lines under unavailability of measurements from the healthy parallel line. The unavailable, here healthy line zero sequence current, is required for reflecting the mutual coupling effect under single phase-to-ground faults (a-g, b-g, c-g faults). The unavailable current is thus estimated. The other faults can be located with the standard fault location algorithm (such as the algorithm from reference [1]).

The sequence of computations for the presented one-end fault location algorithm is as follows.

As shown in the flowchart in FIG. 19 the following measurements are utilized:
voltages from the side A and line LA (faulted) from particular phases: $v_{AA\_a}$, $v_{AA\_b}$, $v_{AA\_c}$,
currents from the side A and line LA (faulted) from particular phases: $i_{AA\_a}$, $i_{AA\_b}$, $i_{AA\_c}$
The utilized input data are as follows:
impedances of the faulted line for the positive ($Z_{1LA}$) and zero ($Z_{0LA}$) sequences impedance of the healthy line for the zero sequence ($Z_{0LB}$)
zero sequence impedance for the mutual coupling ($Z_{0m}$)
information on the fault type (from the protective relay)
mode of the healthy line operation: in operation or switched-off and grounded at both ends).

The measured fault quantities (voltages and currents) undergo adaptive filtering aimed at rejecting the dc components from currents and the transients induced by Capacitive Voltage Transformers (CVTs).

The following equations are used in the method of the present parallel line embodiment. In addition to the algorithm (1) described above for estimating distance to fault (d [pu]) by considering the Kirchhoff's voltage law for the fault loop as seen from the locator installation point:

$$\underline{V}_{AA\_p} - dZ_{1LA}I_{AA\_p} - R_F\left(\frac{a_{F1}\Delta I_{AA1}}{\underline{k}_{F1}} + \frac{a_{F2}I_{AA2}}{\underline{k}_{F2}} + \frac{a_{F0}I_{AA0}}{\underline{k}_{F0}}\right) = 0 \quad (24)$$

the fault loop voltage ($V_{AA\_p}$) and current ($I_{AA\_p}$) can be expressed in terms of the symmetrical quantities:

$$\underline{V}_{AA\_p} = \underline{a}_1\underline{V}_{AA1} + \underline{a}_2\underline{V}_{AA2} + \underline{a}_0\underline{V}_{AA0} \quad (2)$$

and $$I_{AA\_p} = I^{SL}_{AA\_p} + \frac{Z_{0m}}{Z_{1LA}}I_{AB0} \quad (25)$$

where:

$$I^{SL}_{AA\_p} = \underline{a}_1 I_{AA1} + \underline{a}_2 I_{AA2} + \underline{a}_0\frac{Z_{0LA}}{Z_{1LA}}I_{AA0} \quad (25a)$$

is the fault loop current without compensating for the mutual coupling effect (i.e. composed as for the single line—superscript SL), $a_1$, $a_2$, $a_0$—complex coefficients gathered in TABLE 1 (the derivation as in APPENDIX A1), $V_{AA1}$, $V_{AA2}$, $V_{AA0}$—positive, negative and zero sequence of measured voltages, $I_{AA1}$, $I_{AA2}$, $I_{AA0}$—positive, negative and zero sequence current from the faulted line LA, $I_{AB0}$—unavailable zero sequence current from the healthy parallel line LB (to be estimated), $Z_{1LA}$, $Z_{0LA}$—positive and zero sequence impedance the whole line LA, $Z_{0m}$—zero sequence impedance for mutual coupling between the lines LA and LB, $R_F$—unknown fault resistance.

In the next step the symmetrical components of voltages and currents are calculated as shown in FIGS. 3a, 3b. The fault loop signals are composed: the fault loop voltage as in (2), while the fault loop current as in (25). The formulae (2)-(25) present the fault loop signals expressed in terms of the symmetrical components of the measured signals. However, one can use the classic way for composing the fault loop signals.

The presented method covers single phase-to ground faults (a-g, b-g, c-g faults). The other remaining faults have to be located with the fault location algorithms described above or standard fault location algorithm [1]. Distance to fault (d) for the considered here single phase-to ground faults is calculated by solving the quadratic formula for a sought distance to fault (26). Equation (26) is the same as equation (10) except that the values for $B_1, B_2, B_3$ are different to the values determined in (10). The solution gives two roots:

$$d_1 = \frac{-B_1 - \sqrt{B_1^2 - 4B_2B_0}}{2B_2} \quad (26)$$

$$d_2 = \frac{-B_1 + \sqrt{B_1^2 - 4B_2B_0}}{2B_2}$$

(as above, the root which fulfils the condition ($0 \leq d \leq 1$) is selected as the solution for the distance to fault). One has to substitute the following into (26):

$B_2 = \text{real}(A_2)\text{imag}(A_{00}) - \text{real}(A_{00})\text{imag}(A_2)$ $B_1 = \text{real}(A_1)\text{imag}(A_{00}) - \text{real}(A_{00})\text{imag}(A_1)$ $B_0 = \text{real}(A_0)\text{imag}(A_{00}) - \text{real}(A_{00})\text{imag}(A_0)$ where:

$$\underline{A}_2 = -Z_{1LA}\underline{K}_1 I^{SL}_{AA\_p} - \frac{Z_{0m}}{\underline{P}_0}\underline{K}_1 I_{AA0} - \frac{Z_{0m}}{\underline{P}_0}\underline{Q}_0$$

$$\underline{A}_1 = \underline{K}_1\underline{V}_{AA\_p} - Z_{1LA}\underline{L}_1 I^{SL}_{AA\_p} - \frac{Z_{0m}}{\underline{P}_0}\underline{L}_1 I_{AA0}$$

$$\underline{A}_0 = \underline{L}_1\underline{V}_{AA\_p}$$

$$\underline{A}_{00} = -\underline{M}_1 a_{F2} I_{AA2}$$

$$\underline{Q}_0 = \underline{M}_1(\underline{b}_{F1}\Delta I_{AA1} + \underline{b}_{F2}I_{AA2})$$

The recommended SET of the coefficients $b_{F1}$, $b_{F2}$ are taken from TABLE 4 and the recommended SET of the coefficients $a_{F1}$, $a_{F2}$, $a_{F0}$ from TABLE 5.

Fault loop voltage in this embodiment is found from the TABLE below

| Fault loop voltage composed in terms of symmetrical components | Fault loop voltage composed as in the classic approach |
|---|---|
| $\underline{V}_{AA\_p} = \underline{a}_1\underline{V}_{AA1} + \underline{a}_2\underline{V}_{AA2} + \underline{a}_0\underline{V}_{AA0}$ | |
| a-g fault: $\underline{a}_1 = \underline{a}_2 = \underline{a}_0 = 1$ | a-g fault: $\underline{V}_{AA\_p} = \underline{V}_{AA\_a}$ |
| b-g fault: $\underline{a}_1 = \underline{a}^2, \underline{a}_2 = \underline{a}, \underline{a}_0 = 1$ | a-g fault: $\underline{V}_{AA\_p} = \underline{V}_{AA\_b}$ |
| c-g fault: $\underline{a}_1 = \underline{a}, \underline{a}_2 = \underline{a}^2, \underline{a}_0 = 1$ | a-g fault: $\underline{V}_{AA\_p} = \underline{V}_{AA\_c}$ |
| $\underline{a} = \exp(j2\pi/3), \quad j = \sqrt{-1}$ | |

Fault loop current $I_{AA\_p}^{SL}$ composed as for the single line is found from the TABLE below

| $I_{AA\_p}^{SL}$ in terms of symmetrical components | $I_{AA\_p}^{SL}$ as in the classic approach |
|---|---|
| $I_{AA\_p}^{SL} = a_1 I_{AA1} + a_2 I_{AA2} +$ $a_0 \dfrac{Z_{0LA}}{Z_{1LA}} I_{AA0}$ | |
| a-g fault: $a_1 = a_2 = a_0 = 1$ | a-g fault: $I_{AA\_p}^{SL} = I_{AA\_a} + \underline{k}_0 I_{AA0}$ |
| b-g fault: $a_1 = \underline{a}^2, a_2 = \underline{a}, a_0 = 1$ | a-g fault: $I_{AA\_p}^{SL} = I_{AA\_a} + \underline{k}_0 I_{AA0}$ |
| c-g fault: $a_1 = \underline{a}, a_2 = \underline{a}^2, a_0 = 1$ | a-g fault: $I_{AA\_p}^{SL} = I_{AA\_a} + \underline{k}_0 I_{AA0}$ |
| $\underline{a} = \exp(j2\pi/3), \quad j = \sqrt{-1}$ | where: $\underline{k}_0 = \dfrac{Z_{0LA} - Z_{1LA}}{Z_{1LA}}$ |

The complex coefficients dependent on the mode of the healthy parallel line operation:

a) healthy line LB is in operation:

$$\underline{P}_0 = \dfrac{Z_{0LB} - Z_{0m}}{Z_{0LA} - Z_{0m}}$$

$$\underline{K}_1 = -Z_{1LA}(Z_{1sA} + Z_{1sB} + Z_{1LB})$$

$$\underline{L}_1 = -\underline{K}_1 + Z_{1LB} Z_{1sB}$$

$$\underline{M}_1 = Z_{1LA} Z_{1LB} + Z_{1LA}(Z_{1sA} + Z_{1sB}) + Z_{1LB}(Z_{1sA} + Z_{1sB})$$

b) healthy line LB is switched-off and grounded:

$$\underline{P}_0 = -\dfrac{Z_{0LB}}{Z_{0m}}$$

$$\underline{K}_1 = -Z_{1LA}$$

$$\underline{L}_1 = Z_{1LA} + Z_{1sB}$$

$$\underline{M}_1 = Z_{1sA} + Z_{1sA} + Z_{1LA}$$

In another embodiment, which is presented here, the method is applied for the standard availability of the measured signals and is only valid for ground faults, including both:
  single phase-to-ground faults
  phase-to-phase-to-ground faults.

Fault location procedures obtained for these faults under the standard availability of the fault locator input signals are extremely simple and compact. Distance to a fault is calculated with a first order formula.

Figure 22:
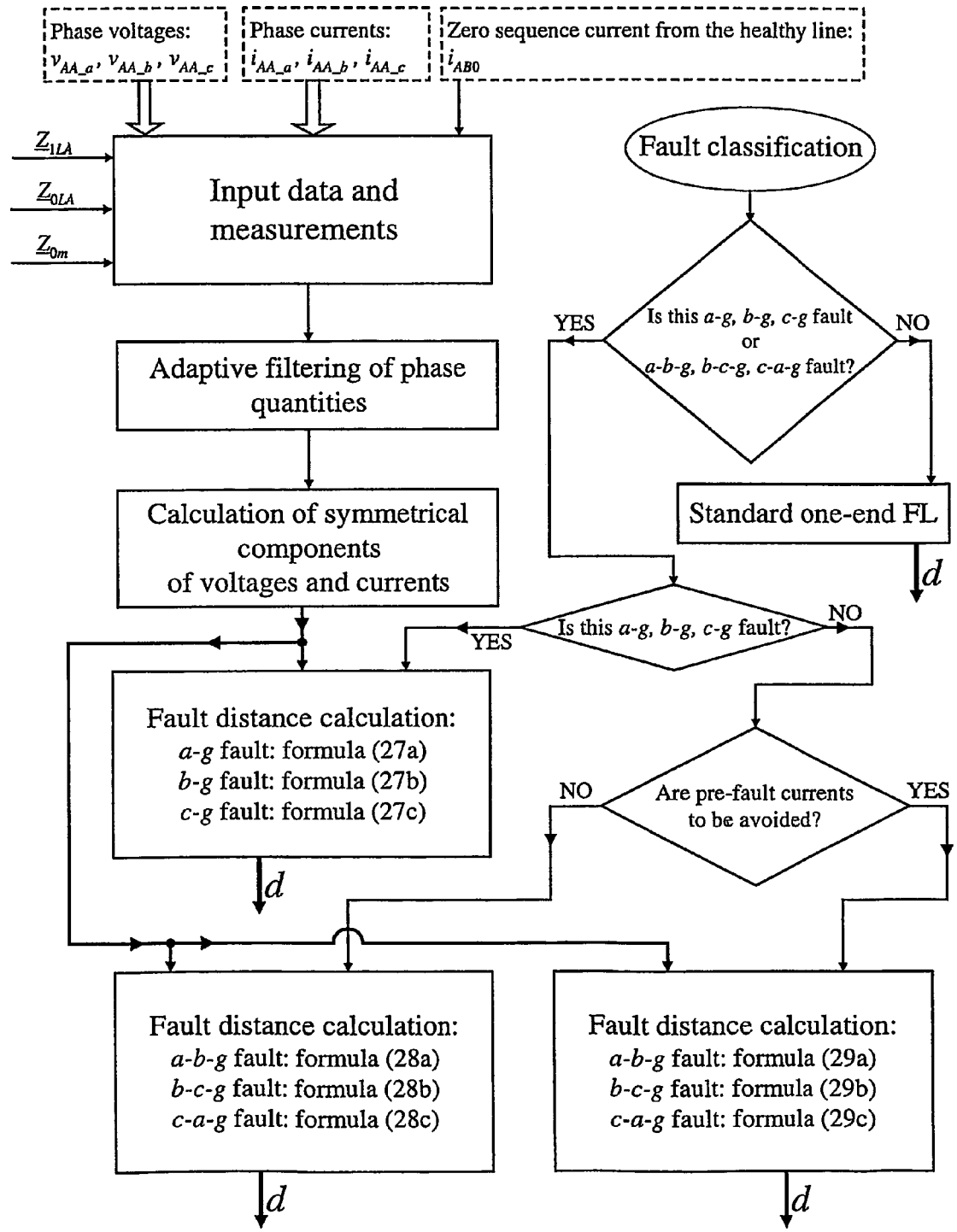
FIG. 22 shows a flowchart for a method for locating phase-to-phase and phase-to-ground faults in parallel lines in the case of providing the zero sequence currents from the healthy parallel line according to another embodiment of the invention.
Figure 23:
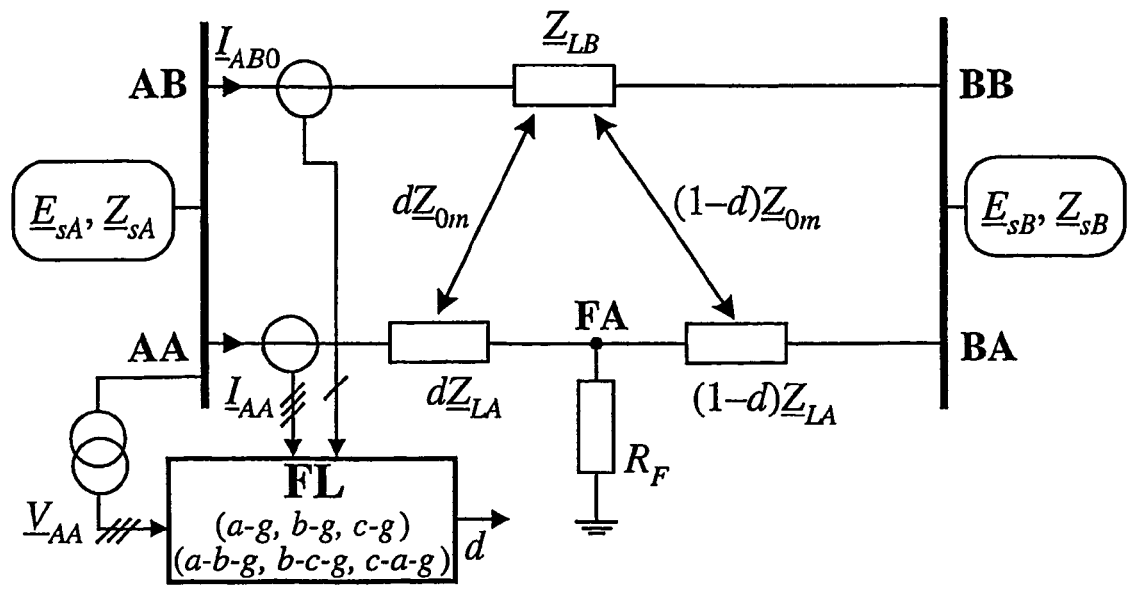
FIG. 23 shows a schematic diagram fault location for parallel lines with standard availability of measurements according to another embodiment of the invention.
Figure 24A:
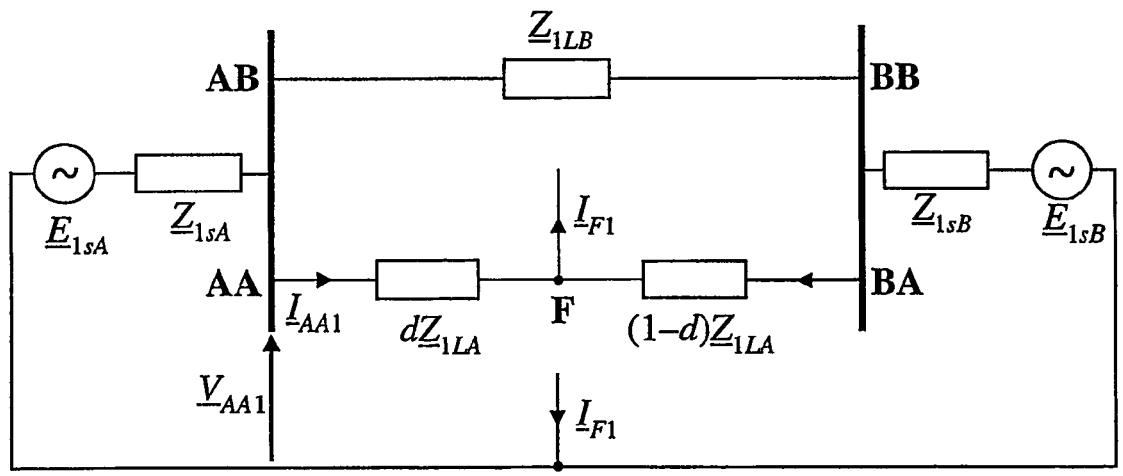
FIGS. 24a,b,c show the equivalent circuit diagrams of parallel lines for positive, negative and zero sequence currents respectively.
Figure 24B:
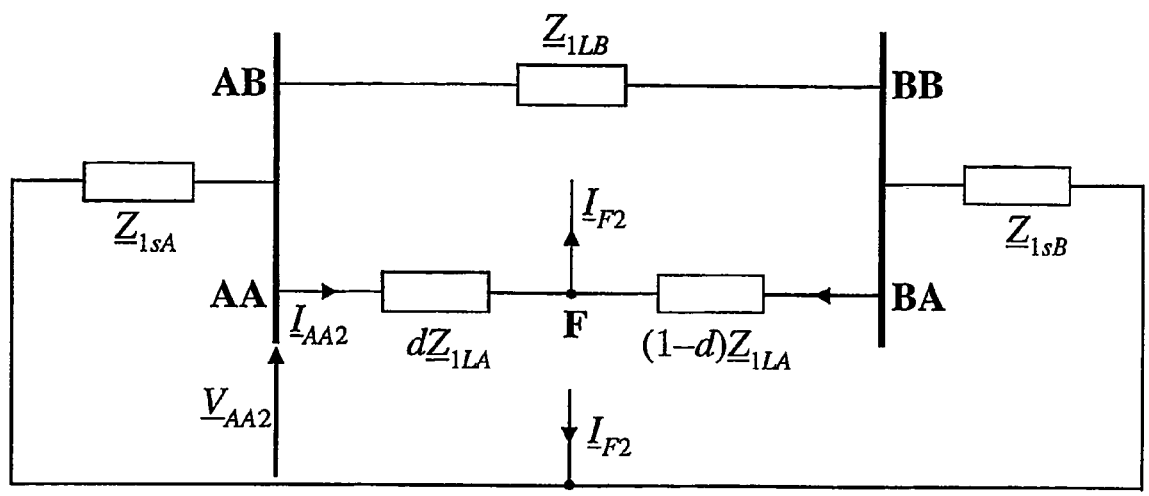
Figure 24C:
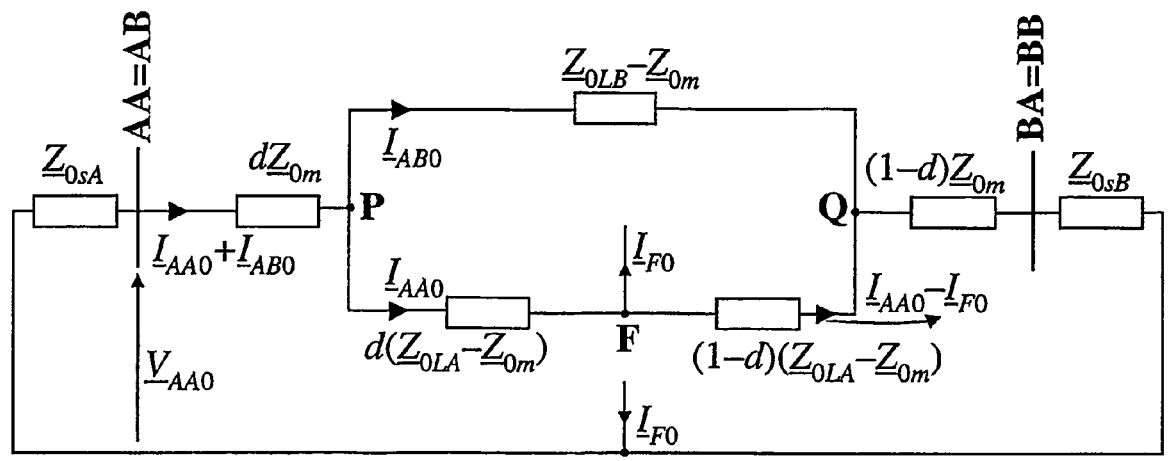

FIG. 22 shows a flow-chart of the developed algorithm for locating ground faults in parallel transmission lines. The sequence of computations for the presented one-end fault locator is as follows. As shown in the flowchart in FIG. 22.B3 the following measurements are utilized:
  voltages from the side A and line LA from particular phases a, b, c: $v_{AA\_a}$, $v_{AA\_b}$, $v_{AA\_c}$
  currents from the side A and line LA from particular phases a, b, c: $i_{AA\_a}$, $i_{AA\_b}$, $i_{AA\_c}$
  zero sequence current from the healthy parallel line LB: $I_{AB0}$ The utilized input data are as follows:
  impedances of the faulted line for the positive ($Z_{1LA}$) and zero ($Z_{0LA}$) sequences,
  impedance of the healthy line for the zero sequence ($Z_{0LB}$)
  zero sequence impedance for the mutual coupling ($Z_{0m}$)
  information on the fault type from the protective relay.

The measured fault quantities (voltages and currents) undergo adaptive filtering aimed at rejecting the dc components from currents and the transients induced by Capacitive Voltage Transformers (CVTs), preferably as described and shown in relation to FIGS. 3a, 3b.

A generalized model of the fault loop, used for deriving the algorithm of the present embodiment, is stated as follows:

$$V_{AA\_p} - dZ_{1LA} I_{AA\_p} - R_F(a_{F1} I_{F1} + a_{F2} I_{F2} + a_{F0} I_{F0}) = 0 \quad (1)$$

where:

d—unknown and sought distance to fault, $Z_{1LA}$—positive sequence impedance of the faulted line, $V_{AA\_p}$, $I_{AA\_p}$—fault loop voltage and current composed according to the fault type, $R_F$—fault resistance, $I_{Fi}$—sequence components of the total fault current (i=0—zero sequence, i=1 positive sequence, i=2—negative sequence), $a_{Fi}$—weighting coefficients (TABLE 2).

Fault loop voltage and current can be expressed as in classic distance protection technique or, as in this document, in terms of the local measurements and with using the coefficients ($a_0$, $a_1$, $a_2$) which are gathered in TABLE 1 (derivation of the coefficients is contained in APPENDIX APP.1):

$$V_{AA\_p} = a_1 V_{AA1} + a_2 V_{AA2} + a_0 V_{AA0} \quad (2)$$

$$I_{AA\_p} = a_1 I_{AA1} + a_2 I_{AA2} + a_0 \dfrac{Z_{0LA}}{Z_{1LA}} I_{AA0} + a_0 \dfrac{Z_{0m}}{Z_{1LA}} I_{AB0} \quad (3)$$

where:

AA, AB—subscripts used for indicating measurements acquired from the faulted line (AA) and from the healthy line (AB), respectively, $Z_{0LA}$, $Z_{0m}$—impedance of the faulted line and mutual coupling between the lines for the zero sequence, respectively.

In the next step the symmetrical components of voltages and currents are calculated as shown in FIGS. 3a, 3b. The fault loop signals are composed: the fault loop voltage as in (2), while the fault loop current as in (3). The formulae (2)-(3) present the fault loop signals expressed in terms of the symmetrical components of the measured signals. However, one may instead use the classic way for composing the fault loop signals, as shown in APPENDIX A1.

The presented method covers single phase-to ground faults (a-g, b-g, c-g faults) and phase-to-phase-to-ground faults (a-b-g, b-c-g, c-a-g faults), thus, the faults for which the highest fault resistance can be expected. The other remaining faults have to be located with the fault location algorithms described above or a standard fault location algorithm, such as for example the fault locator from reference [1]).

Distance to fault (d) for single phase-to-ground faults is calculated as follows:

a-g fault:

$$d = \frac{\text{imag}\{\underline{V}_{AA\_p}[3(I_{AA0} - \underline{P}_0 I_{AB0})]^*\}}{\text{imag}\{(\underline{Z}_{1LA}\underline{I}_{AA\_p})[3(I_{AA0} - \underline{P}_0 I_{AB0})]^*\}} \quad (27a)$$

where:

| Fault loop signals composed in terms of symmetrical components | Fault loop signals composed as in the classic approach |
|---|---|
| $\underline{V}_{AA\_p} = \underline{a}_1 \underline{V}_{AA1} + \underline{a}_2 \underline{V}_{AA2} + \underline{a}_0 \underline{V}_{AA0}$ | $\underline{V}_{AA\_p} = \underline{V}_{AA\_a}$ |
| $I_{AA\_p} = \underline{a}_1 I_{AA1} + \underline{a}_2 I_{AA2} +$ $+ \underline{a}_0 \frac{Z_{0LA}}{Z_{1LA}} I_{AA0} + \underline{a}_0 \frac{Z_{0m}}{Z_{1LA}} I_{AB0}$ | $I_{AA\_p} = I_{AA\_a} + \underline{k}_0 I_{AA0} +$ $\underline{k}_{0m} I_{AB0}$ |
| where: $\underline{a}_1 = \underline{a}_2 = \underline{a}_0 = 1$ | where: $\underline{k}_0 = \frac{Z_{0LA} - Z_{1LA}}{Z_{1LA}},$ $\underline{k}_{0m} = \frac{Z_{0m}}{Z_{1LA}}$ |

$\underline{P}_0 = \frac{Z_{0LB} - Z_{0m}}{Z_{0LA} - Z_{0m}}$ (for symmetrical lines: $\underline{P}_0 = 1$).

b-g fault:

$$d = \frac{\text{imag}\{\underline{V}_{AA\_p}[3\underline{a}^2(I_{AA0} - \underline{P}_0 I_{AB0})]^*\}}{\text{imag}\{(\underline{Z}_{1LA}\underline{I}_{AA\_p})[3\underline{a}^2(I_{AA0} - \underline{P}_0 I_{AB0})]^*\}} \quad (27b)$$

where:

| Fault loop signals composed in terms of symmetrical components | Fault loop signals composed as in the classic approach |
|---|---|
| $\underline{V}_{AA\_p} = \underline{a}_1 \underline{V}_{AA1} + \underline{a}_2 \underline{V}_{AA2} + \underline{a}_0 \underline{V}_{AA0}$ | $\underline{V}_{AA\_p} = \underline{V}_{AA\_b}$ |
| $I_{AA\_p} = \underline{a}_1 I_{AA1} + \underline{a}_2 I_{AA2} +$ $\underline{a}_0 \frac{Z_{0LA}}{Z_{1LA}} I_{AA0} + \underline{a}_0 \frac{Z_{0m}}{Z_{1LA}} I_{AB0}$ | $I_{AA\_p} = I_{AA\_b} + \underline{k}_0 I_{AA0} +$ $\underline{k}_{0m} I_{AB0}$ |
| where: $\underline{a}_1 = \underline{a}^2, \underline{a}_2 = \underline{a}, \underline{a}_0 = 1$ $\underline{a} = \exp(j2\pi/3)$ | where: $\underline{k}_0 = \frac{Z_{0LA} - Z_{1LA}}{Z_{1LA}},$ $\underline{k}_{0m} = \frac{Z_{0m}}{Z_{1LA}}$ |

$\underline{P}_0 = \frac{Z_{0LB} - Z_{0m}}{Z_{0LA} - Z_{0m}}$ (for symmetrical lines: $\underline{P}_0 = 1$).

c-g fault:

$$d = \frac{\text{imag}\{\underline{V}_{AA\_p}[3\underline{a}(I_{AA0} - \underline{P}_0 I_{AB0})]^*\}}{\text{imag}\{(\underline{Z}_{1LA}\underline{I}_{AA\_p})[3\underline{a}(I_{AA0} - \underline{P}_0 I_{AB0})]^*\}} \quad (27c)$$

where:

| Fault loop signals composed in terms of symmetrical components | Fault loop signals composed as in the classic approach |
|---|---|
| $\underline{V}_{AA\_p} = \underline{a}_1 \underline{V}_{AA1} + \underline{a}_2 \underline{V}_{AA2} + \underline{a}_0 \underline{V}_{AA0}$ | $\underline{V}_{AA\_p} = \underline{V}_{AA\_c}$ |
| $I_{AA\_p} = \underline{a}_1 I_{AA1} + \underline{a}_2 I_{AA2} +$ $\underline{a}_0 \frac{Z_{0LA}}{Z_{1LA}} I_{AA0} + \underline{a}_0 \frac{Z_{0m}}{Z_{1LA}} I_{AB0}$ | $I_{AA\_p} = I_{AA\_c} + \underline{k}_0 I_{AA0} +$ $\underline{k}_{0m} I_{AB0}$ |
| where: $\underline{a}_1 = \underline{a}, \underline{a}_2 = \underline{a}^2, \underline{a}_0 = 1$ $\underline{a} = \exp(j2\pi/3)$ | where: $\underline{k}_0 = \frac{Z_{0LA} - Z_{1LA}}{Z_{1LA}},$ $\underline{k}_{0m} = \frac{Z_{0m}}{Z_{1LA}}$ |

$\underline{P}_0 = \frac{Z_{0LB} - Z_{0m}}{Z_{0LA} - Z_{0m}}$ (for symmetrical lines: $\underline{P}_0 = 1$).

Distance to fault (d) for phase-to- phase to ground faults can be calculated in two different ways, depending whether the pre-fault currents can be used or have to be avoided.

1. Procedure for distance to fault calculation with the use of pre-fault measurements:

a-b-g fault:

$$d = \frac{\text{imag}\{\underline{V}_{AA\_p}[\underline{W}(I_{AA0} - \underline{P}_0 I_{AB0})]^*\}}{\text{imag}\{(\underline{Z}_{1LA}\underline{I}_{AA\_p})[\underline{W}(I_{AA0} - \underline{P}_0 I_{AB0})]^*\}} \quad (28a)$$

where:

$\underline{W} = \frac{\underline{A}\Delta I_{AA1} + \underline{B} I_{AA2}}{\underline{C}\Delta I_{AA1} + \underline{D} I_{AA2}},$ $\underline{A} = 1 - \underline{a}^2, \underline{B} = 1 - \underline{a}, \underline{C} = 1 + \underline{a}^2, \underline{D} = 1 + \underline{a}$

| Fault loop signals composed in terms of symmetrical components | Fault loop signals composed as in the classic approach |
|---|---|
| $\underline{V}_{AA\_p} = \underline{a}_1 \underline{V}_{AA1} + \underline{a}_2 \underline{V}_{AA2} + \underline{a}_0 \underline{V}_{AA0}$ | $\underline{V}_{AA\_p} = \underline{V}_{AA\_a} - \underline{V}_{AA\_b}$ |
| $I_{AA\_p} = \underline{a}_1 I_{AA1} + \underline{a}_2 I_{AA2} +$ $\underline{a}_0 \frac{Z_{0LA}}{Z_{1LA}} I_{AA0} + \underline{a}_0 \frac{Z_{0m}}{Z_{1LA}} I_{AB0}$ | $I_{AA\_p} = I_{AA\_a} - I_{AA\_b}$ |
| where: $\underline{a}_1 = 1 - \underline{a}^2, \underline{a}_2 = 1 - \underline{a}, \underline{a}_0 = 0$ $\underline{a} = \exp(j2\pi/3)$ | |

$P_0 = \frac{Z_{0LB} - Z_{0m}}{Z_{0LA} - Z_{0m}}$ (for symmetrical lines: $P_0 = 1$).

b-c-g fault:

$$d = \frac{\text{imag}\{\underline{V}_{AA\_p}[\underline{W}(I_{AA0} - P_0 I_{AB0})]^*\}}{\text{imag}\{(\underline{Z}_{1LA} I_{AA\_p})[\underline{W}(I_{AA0} - P_0 I_{AB0})]^*\}} \quad (28b)$$

where:

$\underline{W} = \frac{A\Delta I_{AA1} + BI_{AA2}}{C\Delta I_{AA1} + DI_{AA2}}$, $\underline{A} = \underline{a}^2 - \underline{a}, \underline{B} = \underline{a} - \underline{a}^2, \underline{C} = -1, \underline{D} = -1$

| Fault loop signals composed in terms of symmetrical components | Fault loop signals composed as in the classic approach |
|---|---|
| $\underline{V}_{AA\_p} = \underline{a}_1 \underline{V}_{AA1} + \underline{a}_2 \underline{V}_{AA2} + \underline{a}_0 \underline{V}_{AA0}$ | $\underline{V}_{AA\_p} = \underline{V}_{AA\_b} - \underline{V}_{AA\_c}$ |
| $I_{AA\_p} = \underline{a}_1 I_{AA1} + \underline{a}_2 I_{AA2} +$ $\underline{a}_0 \frac{Z_{0LA}}{Z_{1LA}} I_{AA0} + \underline{a}_0 \frac{Z_{0m}}{Z_{1LA}} I_{AB0}$ | $I_{AA\_p} = I_{AA\_b} - I_{AA\_c}$ |
| where: $\underline{a}_1 = \underline{a}^2 - \underline{a}, \underline{a}_2 = \underline{a} - \underline{a}^2, \underline{a}_0 = 0$ $\underline{a} = \exp(j2\pi/3)$ | |

$P_0 = \frac{Z_{0LB} - Z_{0m}}{Z_{0LA} - Z_{0m}}$ (for symmetrical lines: $P_0 = 1$).

c-a-g fault:

$$d = \frac{\text{imag}\{\underline{V}_{AA\_p}[\underline{W}(I_{AA0} - P_0 I_{AB0})]^*\}}{\text{imag}\{(\underline{Z}_{1LA} I_{AA\_p})[\underline{W}(I_{AA0} - P_0 I_{AB0})]^*\}} \quad (28c)$$

where:

$\underline{W} = \frac{A\Delta I_{AA1} + BI_{AA2}}{C\Delta I_{AA1} + DI_{AA2}}$, $\underline{A} = \underline{a} - 1, \underline{B} = \underline{a}^2 - 1, \underline{C} = \underline{a} + 1, \underline{D} = \underline{a}^2 + 1$

| Fault loop signals composed in terms of symmetrical components | Fault loop signals composed as in the classic approach |
|---|---|
| $\underline{V}_{AA\_p} = \underline{a}_1 \underline{V}_{AA1} + \underline{a}_2 \underline{V}_{AA2} + \underline{a}_0 \underline{V}_{AA0}$ | $\underline{V}_{AA\_p} = \underline{V}_{AA\_c} - \underline{V}_{AA\_a}$ |
| $I_{AA\_p} = \underline{a}_1 I_{AA1} + \underline{a}_2 I_{AA2} +$ $\underline{a}_0 \frac{Z_{0LA}}{Z_{1LA}} I_{AA0} + \underline{a}_0 \frac{Z_{0m}}{Z_{1LA}} I_{AB0}$ | $I_{AA\_p} = I_{AA\_c} - I_{AA\_a}$ |
| where: $\underline{a}_1 = \underline{a} - 1, \underline{a}_2 = \underline{a}^2 - 1, \underline{a}_0 = 0$ $\underline{a} = \exp(j2\pi/3)$ | |

$P_0 = \frac{Z_{0LB} - Z_{0m}}{Z_{0LA} - Z_{0m}}$ (for symmetrical lines: $P_0 = 1$).

(for symmetrical lines: $P_0 = 1$).

2. Procedure for distance to fault calculation without the use of pre-fault measurements:

a-b-g fault:

$$d = \frac{\text{imag}[(\underline{V}_a + \underline{V}_b)(I_{AA0} - P_0 I_{AB0})^*]}{\text{imag}[Z_{1LA}(I_a + I_b + 2\underline{k}_0 I_{AA0} + 2\underline{k}_{0m} I_{AB0})(I_{AA0} - P_0 I_{AB0})^*]} \quad (29a)$$

b-c-g fault:

$$d = \frac{\text{imag}[(\underline{V}_b + \underline{V}_c)(I_{AA0} - P_0 I_{AB0})^*]}{\text{imag}[Z_{1LA}(I_b + I_c + 2\underline{k}_0 I_{AA0} + 2\underline{k}_{0m} I_{AB0})(I_{AA0} - P_0 I_{AB0})^*]} \quad (29b)$$

c-a-g fault:

$$d = \frac{\text{imag}[(\underline{V}_c + \underline{V}_a)(I_{AA0} - P_0 I_{AB0})^*]}{\text{imag}[Z_{1LA}(I_c + I_a + 2\underline{k}_0 I_{AA0} + 2\underline{k}_{0m} I_{AB0})(I_{AA0} - P_0 I_{AB0})^*]} \quad (29c)$$

where:

$\underline{k}_0 = \frac{Z_{0LA} - Z_{1LA}}{Z_{1LA}}, \underline{k}_{0m} = \frac{Z_{0m}}{Z_{1LA}}$.

It is also noted that while the above describes exemplifying embodiments of the invention, there are several variations and modifications which may be made to the disclosed solution without departing from the scope of the present invention as defined in the appended claims.

Tables

TABLE 1

Coefficients for determining the fault loop voltage ($\underline{V}_{AA\_P}$) and current ($I_{AA\_P}$) in terms of symmetrical components as defined in (2) and (3).

| Fault type | $\underline{a}_1$ | $\underline{a}_2$ | $\underline{a}_0$ |
|---|---|---|---|
| a-g | 1 | 1 | 1 |
| b-g | $\underline{a}^2$ | $\underline{a}$ | 1 |
| c-g | $\underline{a}$ | $\underline{a}^2$ | 1 |
| a-b, a-b-g | $1 - \underline{a}^2$ | $1 - \underline{a}^2$ | 0 |
| a-b-c, a-b-c-g | | | |
| b-c, b-c-g | $\underline{a}^2 - \underline{a}$ | $\underline{a} - \underline{a}^2$ | 0 |
| c-a, c-a-g | $\underline{a} - 1$ | $\underline{a}^2 - 1$ | 0 |

$\underline{a} = \exp(j2\pi/3), \quad j = \sqrt{-1}$

TABLE 1A

Fault loop voltage ($\underline{V}_{AA\_p}$) and current ($\underline{I}_{AA\_p}$) expressed with using the classic approach.

| Fault type | $\underline{V}_{AA\_p}$ | $\underline{I}_{AA\_p}$ |
|---|---|---|
| a-g | $\underline{V}_{AA\_a}$ | $\underline{I}_{AA\_a} + \underline{k}_0 \underline{I}_{AA0} + \underline{k}_{0m} \underline{I}_{AB0}$ |
| b-g | $\underline{V}_{AA\_b}$ | $\underline{I}_{AA\_b} + \underline{k}_0 \underline{I}_{AA0} + \underline{k}_{0m} \underline{I}_{AB0}$ |
| c-g | $\underline{V}_{AA\_c}$ | $\underline{I}_{AA\_c} + \underline{k}_0 \underline{I}_{AA0} + \underline{k}_{0m} \underline{I}_{AB0}$ |
| a-b, a-b-g, a-b-c, a-b-c-g | $\underline{V}_{AA\_a} - \underline{V}_{AA\_b}$ | $\underline{I}_{AA\_a} - \underline{I}_{AA\_b}$ |
| b-c, b-c-g | $\underline{V}_{AA\_b} - \underline{V}_{AA\_c}$ | $\underline{I}_{AA\_b} - \underline{I}_{AA\_c}$ |
| c-a, c-a-g | $\underline{V}_{AA\_c} - \underline{V}_{AA\_a}$ | $\underline{I}_{AA\_c} - \underline{I}_{AA\_a}$ |

$\underline{k}_0 = \dfrac{\underline{Z}_{0LA} - \underline{Z}_{1LA}}{\underline{Z}_{1LA}}$, $\underline{k}_{0m} = \dfrac{\underline{Z}_{0m}}{\underline{Z}_{1LA}}$, $\underline{a} = \exp(j2\pi/3)$, $j = \sqrt{-1}$

TABLE 2

Alternative sets of the weighting coefficients for determining a voltage drop across the fault path resistance

| Fault type | Set I (recommended) | | | Set II | | | Set III | | |
|---|---|---|---|---|---|---|---|---|---|
| | $\underline{a}_{F1}$ | $\underline{a}_{F2}$ | $\underline{a}_{F0}$ | $\underline{a}_{F1}$ | $\underline{a}_{F2}$ | $\underline{a}_{F0}$ | $\underline{a}_{F1}$ | $\underline{a}_{F2}$ | $\underline{a}_{F0}$ |
| a-g | 0 | 3 | 0 | 3 | 0 | 0 | 1.5 | 1.5 | 0 |
| b-g | 0 | $3\underline{a}$ | 0 | $3\underline{a}^2$ | 0 | 0 | $1.5\underline{a}^2$ | $1.5\underline{a}$ | 0 |
| c-g | 0 | $3\underline{a}^2$ | 0 | $3\underline{a}$ | 0 | 0 | $1.5\underline{a}$ | $1.5\underline{a}^2$ | 0 |
| a-b | 0 | $1 - \underline{a}$ | 0 | $1 - \underline{a}^2$ | 0 | 0 | $0.5(1 - \underline{a}^2)$ | $0.5(1 - \underline{a})$ | 0 |
| b-c | 0 | $\underline{a} - \underline{a}^2$ | 0 | $\underline{a}^2 - \underline{a}$ | 0 | 0 | $0.5(\underline{a}^2 - \underline{a})$ | $0.5(\underline{a} - \underline{a}^2)$ | 0 |
| c-a | 0 | $\underline{a}^2 - 1$ | 0 | $\underline{a} - 1$ | 0 | 0 | $0.5(\underline{a} - 1)$ | $0.5(\underline{a}^2 - 1)$ | 0 |
| a-b-g | $1 - \underline{a}^2$ | $1 - \underline{a}$ | 0 | $1 - \underline{a}^2$ | $1 - \underline{a}$ | 0 | $1 - \underline{a}^2$ | $1 - \underline{a}$ | 0 |
| b-c-g | $\underline{a}^2 - \underline{a}$ | $\underline{a} - \underline{a}^2$ | 0 | $\underline{a}^2 - \underline{a}$ | $\underline{a} - \underline{a}^2$ | 0 | $\underline{a}^2 - \underline{a}$ | $\underline{a} - \underline{a}^2$ | 0 |
| c-a-g | $\underline{a} - 1$ | $\underline{a}^2 - 1$ | 0 | $\underline{a} - 1$ | $\underline{a}^2 - 1$ | 0 | $\underline{a} - 1$ | $\underline{a}^2 - 1$ | 0 |
| a-b-c-g (a-b-c) | $1 - \underline{a}^2$ | 0 | 0 | $1 - \underline{a}^2$ | 0 | 0 | $1 - \underline{a}^2$ | 0 | 0 |

$\underline{a} = \exp(j2\pi/3)$, $j = \sqrt{-1}$

TABLE 3

Coefficients for determining a fault current distribution factor (6)

SINGLE LINE (FIG. 4)

$\underline{Z}_{1AB} \neq \infty$
$\underline{K}_1 = -\underline{Z}_{1L}\underline{Z}_{1AB} - (\underline{Z}_{1sA} + \underline{Z}_{1sB})\underline{Z}_{1L}$
$\underline{L}_1 = \underline{Z}_{1L}(\underline{Z}_{1sA} + \underline{Z}_{1sB}) + \underline{Z}_{1AB}(\underline{Z}_{1L} + \underline{Z}_{1sB})$
$\underline{M}_1 = (\underline{Z}_{1sA} + \underline{Z}_{1sB})(\underline{Z}_{1AB} + \underline{Z}_{1L}) + \underline{Z}_{1L}\underline{Z}_{1AB}$ $\underline{Z}_{1AB} \to \infty$
$\underline{K}_1 = -\underline{Z}_{1L}$
$\underline{L}_1 = \underline{Z}_{1L} + \underline{Z}_{1sB}$
$\underline{M}_1 = \underline{Z}_{1sA} + \underline{Z}_{1sB} + \underline{Z}_{1L}$

TABLE 3-continued

Coefficients for determining a fault current distribution factor (6)

PARALLEL LINES (FIG. 5)

$\underline{K}_1 = -\underline{Z}_{1LA}(\underline{Z}_{1sA} + \underline{Z}_{1sB} + \underline{Z}_{1LB+AB})$
$\underline{L}_1 = \underline{Z}_{1LA}(\underline{Z}_{1sA} + \underline{Z}_{1sB} + \underline{Z}_{1LB\&AB}) + \underline{Z}_{1LB\&AB}\underline{Z}_{1sB1}$
$\underline{M}_1 = \underline{Z}_{1LA}\underline{Z}_{1LB\&AB} + \underline{Z}_{1LA}(\underline{Z}_{1sA} + \underline{Z}_{1sB}) + \underline{Z}_{1LB\&AB}(\underline{Z}_{1sA} + \underline{Z}_{1sB})$

TABLE 4

The recommended SET of the coefficients $b_{F1}$, $b_{F2}$ in relation to (26)

| Fault | $b_{F1}$ | $b_{F2}$ |
|---|---|---|
| a-g | 0 | 1 |
| b-g | 0 | $\underline{a}^2$ |
| c-g | 0 | $\underline{a}$ |

$\underline{a} = \exp(j2\pi/3)$, $j = \sqrt{-1}$

TABLE 5

The recommended SET of the coefficients $a_{F1}$, $a_{F2}$, $a_{F0}$ in relation to (26)

| FAULT | $a_{F1}$ | $a_{F2}$ | $a_{F0}$ |
|---|---|---|---|
| a-g | 0 | 3 | 0 |
| b-g | 0 | $3\underline{a}$ | 0 |
| c-g | 0 | $3\underline{a}^2$ | 0 |

$\underline{a} = \exp(j2\pi/3)$, $j = \sqrt{-1}$

REFERENCES

[1] Eriksson L., Saha M. M., Rockefeller G. D.: An accurate fault locator with compensation for apparent reactance in the fault resistance resulting from remote-end infeed, IEEE Transactions on PAS, Vol. PAS-104, No. 2, February 1985, pp. 424-436.

[2] Saha M. M.: Method and device for locating a fault point on a three-phase power transmission line. U.S. Pat. No. 4,559,491, Date of Patent: Dec. 17, 1985.

[3] McLAREN P. G., SWIFT G. W., ZHANG Z., DIRKS E., JAYASINGHLE R. P., FERNANDO I., A new positive sequence directional element for numerical distance relays, Proceedings of the Stockholm Power Tech Conference, Stockholm, Sweden, 1995, pp. 540-545.

[4] SAHA N. M., IZYKOWSKI J., KASZTENNY B., ROSOLOWSKI E., PALKI B. S., Relaying algorithms for protection of series-compensated lines, Proceedings of the International Conference on Modern Trends in the Protection Schemes of Electric Power Apparatus and Systems, Oct. 28-30, 1998, New Delhi, India, pp. V-50-61.

[5] NOVOSEL D., HART D. G., UDREN E., GARITTY J., Unsynchronized two-terminal fault location estimation, IEEE Transactions on Power Delivery, Vol. 11, No. 1, January 1996, pp. 130-138.

APPENDICES

A1. Derivation of the Coefficients $a_1, a_2, a_0$ (TABLE 1)
Single phase-to-ground fault: a-g fault $$V_{AA\_p} = V_{AA\_a} = V_{AA1} + V_{AA2} + V_{AA0} = a_1 V_{AA1} + a_2 V_{AA2} + a_0 V_{AA0}$$

$$I_{AA\_p} = I_{AA\_a} + \underline{k}_0 I_{AA0} + \underline{k}_{0m} I_{AB0} =$$

$$I_{AA1} + I_{AA2} + I_{AA0} + \frac{\underline{Z}_{0LA} - \underline{Z}_{1LA}}{\underline{Z}_{1LA}} I_{AA0} + \frac{\underline{Z}_{0m}}{\underline{Z}_{1LA}} I_{AB0} =$$

$$I_{AA1} + I_{AA2} + \frac{\underline{Z}_{0LA}}{\underline{Z}_{1LA}} I_{AA0} + \frac{\underline{Z}_{0m}}{\underline{Z}_{1LA}} I_{AB0} =$$

$$\underline{a}_1 I_{AA1} + \underline{a}_2 I_{AA2} + \underline{a}_0 \frac{\underline{Z}_{0LA}}{\underline{Z}_{1LA}} I_{AA0} + \underline{a}_{0m} \frac{\underline{Z}_{0m}}{\underline{Z}_{1LA}} I_{AB0}$$

Thus: $a_1 = a_2 = a_0 = 1$
Inter-phase faults: a-b, a-b-g, a-b-c, a-b-c-g faults $$\underline{V}_{AA\_p} =$$

$$\underline{V}_{AA\_a} - \underline{V}_{AA\_b} = (\underline{V}_{AA1} + \underline{V}_{AA2} + \underline{V}_{AA0}) - (\underline{a}^2 \underline{V}_{AA1} + \underline{a} \underline{V}_{AA2} + \underline{V}_{AA0}) =$$

$$(1 - \underline{a}^2) \underline{V}_{AA1} + (1 - \underline{a}) \underline{V}_{AA2} = \underline{a}_1 \underline{V}_{AA1} + \underline{a}_2 \underline{V}_{AA2} + \underline{a}_0 \underline{V}_{AA0} I_{AA\_p} =$$

$$I_{AA\_a} - I_{AA\_b} = (I_{AA1} + I_{AA2} + I_{AA0}) - (\underline{a}^2 I_{AA1} + \underline{a} I_{AA2} + I_{AA0}) =$$

$$(1 - \underline{a}^2) I_{AA1} + (1 - \underline{a}) I_{AA2} = \underline{a}_1 I_{AA1} + \underline{a}_2 I_{AA2} + \underline{a}_0 \frac{\underline{Z}_{L0}}{\underline{Z}_{L1}} I_{AA0}$$

Thus: $a_1 = 1-a^2$, $a_2 = 1-a$, $a_0 = 0$

A2. Derivation of Coefficients $a_{F1}, a_{F2}, a_{F0}$ (TABLE 2)

TABLE 2 contains three alternative sets (Set I, Set II, Set III) of the weighting coefficients, which are used for determining a voltage drop across a fault path. The coefficients are calculated from the boundary conditions—relevant for a particular fault type. This is distinctive that in all the sets the zero sequence is omitted ($a_{F0}=0$). This is advantage since the zero sequence impedance of a line is considered as the uncertain parameter. By setting $a_{F0}=0$ we limit adverse influence of the uncertainty with respect to the zero sequence impedance data upon the fault location accuracy.

Figure 12:
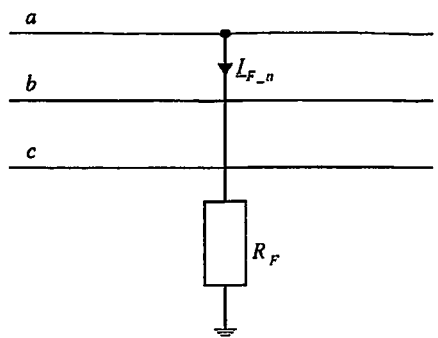
FIG. 12 and FIGS. 13a, 13b, 14, 15a and 15b show schematic diagrams of possible fault-types (phase-to-phase, phase-to-ground and so on) with respect to derivation of coefficients for Table 2 in Appendix A2.

To be precise one has to note that this limitation is of course partial since it is related only to determining the voltage drop across a fault path. In contrast, while determining the voltage drop across a faulted line segment the zero sequence impedance of the line is used.

a-g fault, FIG. 12:

Taking into account that in the healthy phases: $I_{F\_b} = I_{F\_c} = 0$ what gives:

$$I_{F1} = \frac{1}{3}(I_{F\_a} + \underline{a} I_{F\_b} + \underline{a}^2 I_{F\_c}) = \frac{1}{3}(I_{F\_a} + \underline{a} 0 + \underline{a}^2 0) = \frac{1}{3} I_{F\_a}$$

$$I_{F2} = \frac{1}{3}(I_{F\_a} + \underline{a}^2 I_{F\_b} + \underline{a} I_{F\_c}) = \frac{1}{3}(I_{F\_a} + \underline{a}^2 0 + \underline{a} 0) = \frac{1}{3} I_{F\_a}$$

$$I_{F0} = \frac{1}{3}(I_{F\_a} + I_{F\_b} + I_{F\_c}) = \frac{1}{3}(I_{Fa} + 0 + 0) = \frac{1}{3} I_{F\_a}$$

Figure 13A:
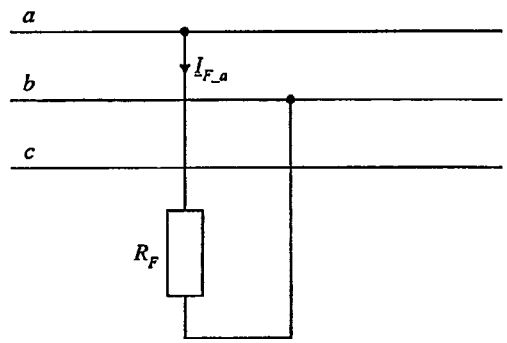
Figure 13B:
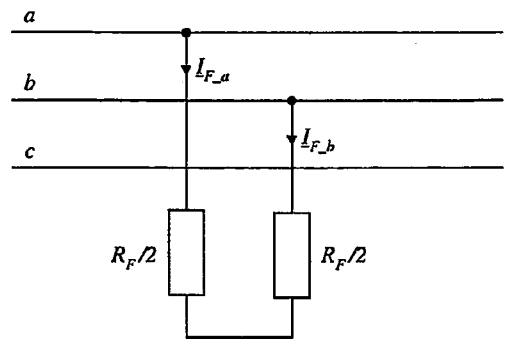

The sequence components are related: $I_{F1} = I_{F2} = I_{F0}$ and finally:

$I_F = I_{F\_a} = 3 I_{F2}$, thus: $a_{F1}=0$, $a_{F2}=3$, $a_{F0}=0$ (as in the Set I from Table 2)

or $I_F = I_{F\_a} = 3 I_{F1}$, thus: $a_{F1}=3$, $a_{F2}=0$, $a_{F0}=0$ (as in the Set II from Table 2)

or $I_F = I_{F\_a} = 1{,}5 I_{F1} + 1{,}5 I_{F2}$, thus: $a_{F1}=1{,}5$, $a_{F2}=1{,}5$, $a_{F0}=0$ (as in the Set III from Table 2)

a-b fault FIGS. 13a, 13b: The fault current can be expressed as: $I_F = I_{F\_a}$ or as:

$$I_F = \frac{1}{2}(I_{F\_a} - I_{F\_b})$$

Taking into account that in the healthy phase: $I_{F\_c}=0$ and for the faulted phases: $I_{F\_b} = -I_{F\_a}$ what gives:

$$I_{F1} = \frac{1}{3}(I_{F\_a} + \underline{a} I_{F\_b} + \underline{a}^2 I_{F\_c}) = \frac{1}{3}(I_{F\_a} + \underline{a}(-I_{F\_a}) + \underline{a}^2 0) = \frac{1}{3}(1 - \underline{a}) I_{F\_a}$$

$$I_{F2} = \frac{1}{3}(I_{F\_a} + \underline{a}^2 I_{F\_b} + \underline{a} I_{F\_c}) = \frac{1}{3}(I_{F\_a} + \underline{a}^2(-I_{F\_a}) + \underline{a} 0) = \frac{1}{3}(1 - \underline{a}^2) I_{F\_a}$$

$$I_{F0} = \frac{1}{3}(I_{F\_a} + I_{F\_b} + I_{F\_c}) = \frac{1}{3}(I_{F\_a} + (-I_{F\_a}) + 0) = 0$$

The relation between $I_{F1}$ and $I_{F2}$ is thus:

$$\frac{I_{F1}}{I_{F2}} = \frac{\frac{1}{3}(1-\underline{a}) I_{F\_a}}{\frac{1}{3}(1-\underline{a}^2) I_{F\_a}} = \frac{(1-\underline{a})}{(1-\underline{a}^2)}$$

Finally:

$$I_F = I_{F\_a} = \frac{3}{(1-\underline{a}^2)} I_{F2} = (1-\underline{a}) I_{F2}$$

thus: $a_{F1}=0$, $a_{F2}=1-a$, $a_{F0}=0$ (as in the Set I from Table 2)

or $$I_F = I_{F\_a} = \frac{3}{(1-\underline{a})}I_{F1} = (1-\underline{a}^2)I_{F1}$$

thus: $a_{F1}=1-\underline{a}$, $a_{F2}=0$, $a_{F0}=0$ (as in the SET 2 from Table 2)

or $$I_F = 0{,}5I_{F\_a} + 0{,}5I_{F\_a} =$$
$$\frac{1{,}5}{(1-\underline{a}^2)}I_{F2} + \frac{1{,}5}{(1-\underline{a})}I_{F1} = 0{,}5(1-\underline{a})I_{F2} + 0{,}5(1-\underline{a}^2)I_{F1}$$

thus: $a_{F1}=0{,}5(1-a^2)$, $a_{F2}=0{,}5(1-a)$, $a_{F0}=0$ (as in the Set III from Table 2)

Figure 14:
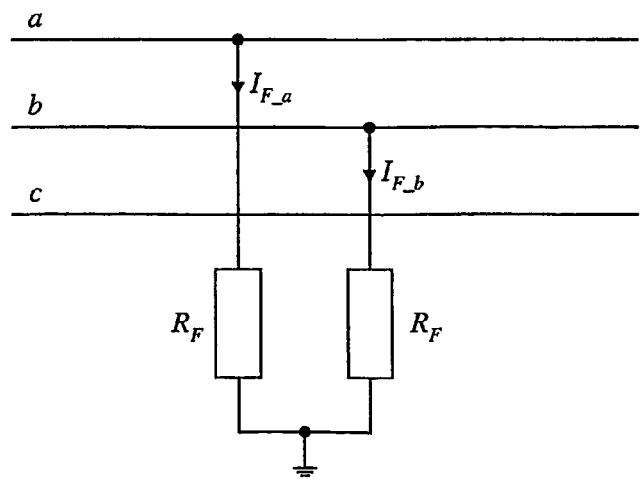

(a-b-g) fault, FIG. 14:

$$I_F = I_{F\_a} - I_{F\_b} =$$
$$(I_{F1} + I_{F2} + I_{F0}) - (\underline{a}^2 I_{F1} + \underline{a}I_{F2} + I_{F0}) = (1-\underline{a}^2)I_{F1} + (1-\underline{a})I_{F2}$$

Thus: $a_{F1}=1-a^2$, $a_{F2}=1-a$, $a_{F0}=0$ (as in the Sets I, II, III from Table 2)

Figure 15A:
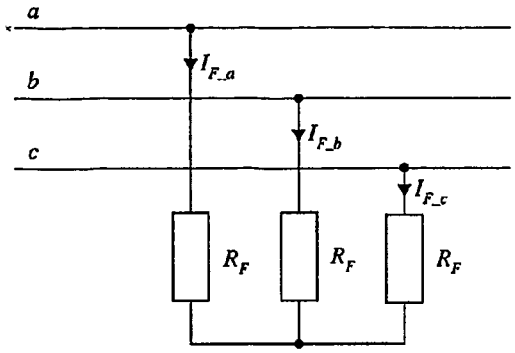
Figure 15B:
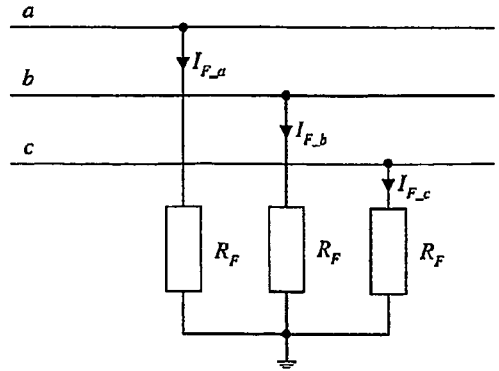

(a-b-c) or (a-b-c-g) symmetrical faults, FIGS. 15*a*, 15*b*, 15*c*:

Taking the first two phases (a, b) for composing the voltage drop across a fault path one obtains:

$$I_F = I_{F\_a} - I_{F\_b} =$$
$$(I_{F1} + I_{F2} + I_{F0}) - (\underline{a}^2 I_{F1} + \underline{a}I_{F2} + I_{F0}) = (1-\underline{a}^2)I_{F1} + (1-\underline{a})I_{F2}$$

Thus:

$a_{F1}=1-a^2$, $a_{F2}=1-a$, $a_{F0}=0$

Additionally, if a fault is ideally symmetrical the positive sequence is the only component, which is present in the signals. Therefore, we have:

$a_{F1}=1-a^2$, $a_{F2}=0$, $a_{F0}=0$ (as in the Sets I, II, III from Table 2).

A3. Derivation of the Complex Coefficients in the Fault Current Distribution Factors for the Positive (Negative) Sequence (Table 3)

a) Case of the single line with extra link 45 between the substations (FIG. 4)

Figure 16:
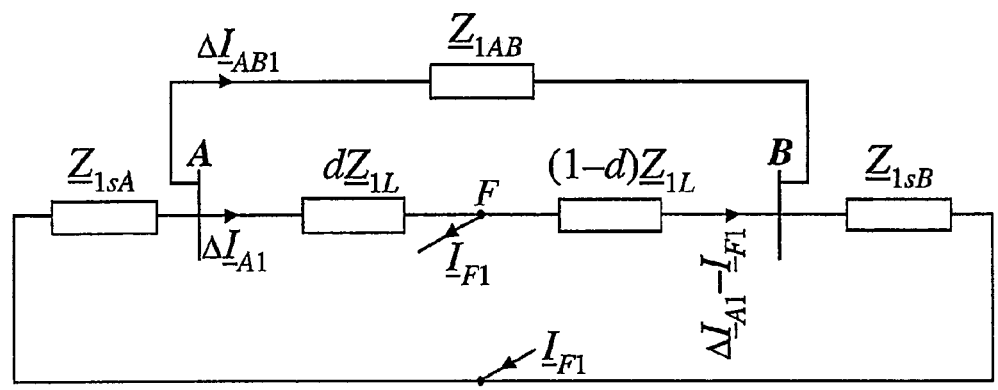
FIGS. 16 and 17 show schematic diagrams for the derivation of the complex coefficients in the fault current distribution factors for the positive (negative) sequence included in Table 3.

Let us determine the fault current distribution factor for the positive sequence (the fault current distribution factor for the negative sequence is the same). The equivalent circuit of FIG. 4 with indicated flow of currents for the incremental positive sequence is presented in FIG. 16.

Considering the closed mesh containing: the local segment of the faulted line, the remote segment of the faulted line and the extra link between the substations, one can write down:

$$dZ_{1L}\Delta I_{A1} + (1-d)Z_{1L}(\Delta I_{A1} - I_{F1}) - Z_{1AB}\Delta I_{AB1} = 0$$

From the above equation the unknown current from the extra link between the substation can be determined as:

$$\Delta I_{AB1} = \frac{Z_{1L}}{Z_{1AB}}(\Delta I_{A1} - (1-d)I_{F1})$$

Considering the closed mesh containing the source impedances ($Z_{1sA}$, $Z_{1sB}$) and the extra link ($Z_{1AB}$) one can write down:

$$Z_{1sA}(\Delta I_{A1} + \Delta I_{AB1}) + Z_{1AB}\Delta I_{AB1} + Z_{1sB}(\Delta I_{A1} + \Delta I_{AB1} - I_{F1}) = 0$$

Substituting the previously determined unknown current from the extra link into the above equation one obtains:

$$\underline{k}_{F1} = \frac{\Delta I_{A1}}{I_{F1}} = \frac{\underline{K}_1 d + \underline{L}_1}{\underline{M}_1}$$

where, as in TABLE 3 (Single line, $Z_{1AB} \neq \infty$), we have:

$K_1 = -Z_{1L}Z_{1AB} - (Z_{1sA} + Z_{1sB})Z_{1L}$ $L_1 = Z_{1L}(Z_{1sA} + Z_{1sB}) + Z_{1AB}(Z_{1L} + Z_{1sB})$ $M_1 = (Z_{1sA} + Z_{1sB})(Z_{1AB} + Z_{1L}) + Z_{1L}Z_{1AB}$

If there is no extra link between the substations ($Z_{1AB} \to \infty$) one has to consider the closed mesh containing the source impedances ($Z_{1sA}$, $Z_{1sB}$) and both the segments of the faulted line [$dZ_{1L}$ and $(1-d)Z_{1L}$]. For this mesh one can write:

$$(Z_{1sA} + dZ_{1L})\Delta I_{A1} + [Z_{1sB} + (1-d)Z_{1L}](\Delta I_{A1} - I_{F1}) = 0$$

After rearrangements one obtains:

$$\underline{k}_{F1} = \frac{\Delta I_{A1}}{I_{F1}} = \frac{\underline{K}_1 d + \underline{L}_1}{\underline{M}_1}$$

where, as in TABLE 3 (Single line, $Z_{1AB} \to \infty$), we have:

$K_1 = -Z_{1L}$ $L_1 = Z_{1L} + Z_{1sB}$ $M_1 = Z_{1sA} + Z_{1sA} + Z_{1L}$ b) Case of the parallel lines with extra link between the substation (FIG. 5)

Figure 17:
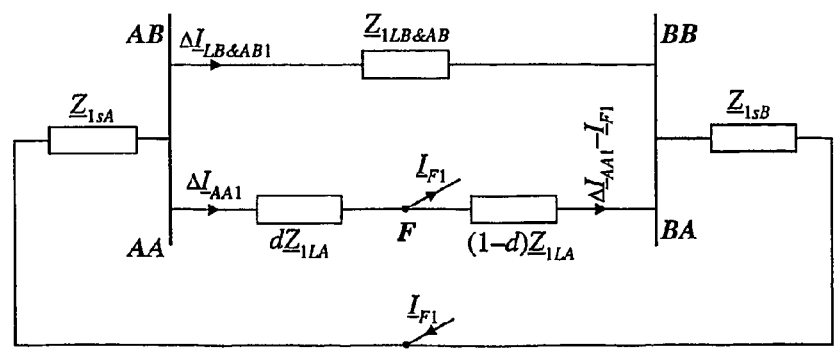

Let us determine the fault current distribution factor for the positive sequence (the fault current distribution factor for the negative sequence is the same). The equivalent circuit of parallel lines from FIG. 5 with indicated flow of currents for the incremental positive sequence is presented in FIG. 17.

The healthy parallel line (LB) and the extra link 55 (AB), which are in parallel connection, have been substituted by the equivalent branch with the equivalent impedance:

$$Z_{1LB\&AB} = \frac{Z_{1LB}Z_{1AB}}{Z_{1LB} + Z_{1AB}}.$$

Considering the closed mesh denoted by (AA, F, BA, BB, AB) one can write:

$$dZ_{1LA}\Delta I_{AA1}+(1-d)Z_{1LA}(\Delta I_{AA1}-I_{F1})-Z_{1LB\&AB}\Delta I_{LB\&AB1}=0$$

From the above equation the unknown current from the equivalent branch can be determined as:

$$\Delta I_{LB\&AB1} = \frac{Z_{1LA}}{Z_{1LB\&AB}}(\Delta I_{AA1} - (1-d)I_{F1})$$

Considering the closed mesh containing the source impedances ($Z_{1sA}$, $Z_{1sB}$) and the equivalent branch ($Z_{1LB\&AB}$) one can write down:

$$Z_{1sA}(\Delta I_{AA1}+\Delta I_{LB\&AB1})+Z_{1LB\&AB}\Delta I_{LB\&AB1}+Z_{1sB}(\Delta I_{AA1}+\Delta I_{LB\&AB1}-I_{F1})=0$$

Substituting the previously determined unknown current from the healthy line into the above equation one obtains:

$$\underline{k}_{F1} = \frac{\Delta I_{AA1}}{I_{F1}} = \frac{K_1 d + L_1}{M_1}$$

where, as in TABLE 3 (Parallel lines), we have:

$$K_1 = -Z_{1LA}(Z_{1sA}+Z_{1sB}+Z_{1LB\&AB}),$$

$$L_1 = Z_{1LA}(Z_{1sA}+Z_{1sB}+Z_{1LB\&AB})+Z_{1LB\&AB}Z_{1sB1}$$

$$M_1 = Z_{1LA}Z_{1LB\&AB}+Z_{1LA}(Z_{1sA}+Z_{1sB})+Z_{1LB\&AB}(Z_{1sA}+Z_{1sB})$$

where:

$$Z_{1LB\&AB} = \frac{Z_{1LB}Z_{1AB}}{Z_{1LB}+Z_{1AB}}.$$

In case if the extra link between the substations ($Z_{1AB}$) is not present one has to substitute: $Z_{1LB\&AB}=Z_{1LB}$.

The invention claimed is:

1. A method to locate a fault from one end of a section of a power line by means of measurements of current, voltage and angles between the phases at a first end of said section, the method comprising:
    calculating symmetrical components of currents for said current and voltage measurement at said first end,
    calculating a value of impedance for an extra link between the terminals with the impedance for the positive sequence equal to:

$$\left(Z_{1LB\&AB} = \frac{Z_{1LB}Z_{1AB}}{Z_{1LB}+Z_{1AB}}\right)$$

where:

$Z_{1AB}$=impedance for the positive sequence of the extra link,
$Z_{1LA}$=positive-sequence impedance of the healthy line,
    determining a compensation for the shunt capacitance with the aid of an equation of the form:

$$B_2^{comp-1}(d_{comp\_1})^2+B_1^{comp-1}d_{comp\_1}+B_0^{comp-1}=0$$
where:

$$B_2^{comp-1}=A_{2\_Re}^{comp-1}A_{00\_Im}^{comp-1}-A_{2\_Im}^{comp-1}A_{00\_Re}^{comp-1}$$

$$B_1^{comp-1}=A_{1\_Re}^{comp-1}A_{00\_Im}^{comp-1}-A_{1\_Im}^{comp-1}A_{00\_Re}^{comp-1}$$

$$B_0^{comp-1}=A_{0\_Re}^{comp-1}A_{00\_Im}^{comp-1}-A_{0\_Im}^{comp-1}A_{00\_Re}^{comp-1}$$

determining the zero-sequence current from the healthy line of a section of parallel power lines,
    calculating a distance to a fault for the parallel line section,
    calculating the distance to the fault from said first end using a quadratic equation of the form:

$$B_2 d^2+B_1 d+B_0=0 \text{ where:}$$

$$B_2=A_{2\_Re}A_{00\_Im}-A_{2\_Im}A_{00\_Re}$$

$$B_1=A_{1\_Re}A_{00\_Im}-A_{1\_Im}A_{00\_Re}$$

$$B_0=A_{0\_Re}A_{00\_Im}-A_{0\_Im}A_{00\_Re} \text{ and}$$

locating the fault utilizing the calculated distances.
2. The method according to claim 1, wherein the distance to the fault is calculated using an equation of the form:

$$K_1 Z_{1L} d^2 + (L_1 Z_{1L} - K_1 Z_{AA\_p})d - L_1 Z_{AA\_p} + R_F M_1 \frac{(a_{F1}\Delta I_{AA1}+a_{F2}I_{AA2})}{I_{AA\_p}} = 0 \quad (8)$$

where:

$$Z_{AA\_p} = \frac{V_{AA\_p}}{I_{AA\_p}}$$

calculated fault loop impedance.
3. The method according to claim 1, wherein the distance to the fault is calculated using an equation of the form:

$$A_2 d^2+A_1 d+A_0+A_{00}R_F=0$$

where:

$$A_2=A_{2\_Re}+jA_{2\_Im}=K_1 Z_{1LA}$$

$$A_1=A_{1\_Re}+jA_{1\_Im}=L_1 Z_{1LA}-K_1 Z_{AA\_p}$$

$$A_0=A_{0\_Re}+jA_{0\_Im}=-L_1 Z_{AA\_p}$$

$$A_{00\_Re}+jA_{00\_Im}=\frac{M_1(a_{F1}\Delta I_{AA1}+a_{F2}I_{AA2})}{I_{AA\_p}}$$

$$Z_{AA\_p}=\frac{V_{AA\_p}}{I_{AA\_p}}=\text{calculated fault loop impedance}$$

$K_1$, $L_1$, $M_1$=coefficients gathered in TABLE 3.
4. The method according to claim 1, further comprising:
    determining source impedance at said first end as a representative value, and
    determining a value for source impedance at said second end as a representative value.

5. The method according claim 1, further comprising calculating symmetrical components of currents for said current and voltage measured at said first end by:
inputting instantaneous phase voltages,
filtering the values to determine the phasors, and
calculating phasors of symmetrical components of voltages.

6. The method according to claim 1, further comprising calculating symmetrical components of currents for said current and voltage measured at said first end by:
inputting instantaneous phase currents and instantaneous zero-sequence current from a healthy line,
filtering the values to determine the phasors, and
calculating phasors of symmetrical components of currents.

7. The method according to claim 1, further comprising determining a compensation for shunt capacitance by means of an equation of the form:

$$\underline{A}_2^{comp\_1}(d_{comp\_1})^2 + \underline{A}_1^{comp\_1}d_{comp\_1} + \underline{A}_0^{comp\_1} + \underline{A}_{00}^{comp\_1}R_F = 0$$

$$\underline{A}_2^{comp\_1} = A_{2\_Re}^{comp\_1} + jA_{2\_Im}^{comp\_1} = K_1 Z_{1L}^{long}$$

$$\underline{A}_1^{comp\_1} = A_{1\_Re}^{comp\_1} + jA_{1\_Im}^{comp\_1} = L_1 Z_{1L}^{long} - K_1 \underline{Z}_{A\_p}^{comp\_1}$$

$$\underline{A}_0^{comp\_1} = A_{0\_Re}^{comp\_1} + jA_{0\_Im}^{comp\_1} = -L_1 \underline{Z}_{A\_p}^{comp\_1}$$

$$\underline{A}_{00}^{comp\_1} = A_{00\_Re}^{comp\_1} + jA_{00\_Im}^{comp\_1} = \frac{M_1(a_{F1}\Delta I_{AA1} + a_{F2}I_{AA2})}{I_{A\_p}^{comp\_1}}$$

(21a) where:

$$\underline{Z}_{A\_p}^{com\_1} = \frac{V_{A\_p}}{I_{A\_p}^{comp\_1}}$$

fault loop impedance calculated from:
$V_{A\_p}$—original (uncompensated) fault loop voltage,
$I_{A\_p}^{comp\_1} = a_1 I_{A1\_comp\_1} + a_2 I_{A2\_comp\_1} + a_0 I_{A0\_comp\_1}$—
fault loop current composed of the positive, negative and zero sequence currents obtained after deducing the respective capacitive currents from the original currents, and
$K_1, L_1, M_1$=coefficients gathered in TABLE 3.

8. The method according to claim 1, further comprising measuring the source impedance $Z_{1sA}$ at said first end A.

9. The method according to claim 1, further comprising:
measuring the source impedance $Z_{1sB}$ at said second end,
sending a communication of the measured value of source impedance $Z_{1sB}$ at said second end to a fault locator at said first end.

10. The method according to claim 1, further comprising determining the distance to a single phase to ground fault without measurements from an operating healthy parallel line by means of complex coefficients $P_0$ according to a formula of the form:

$$\underline{P}_0 = \frac{\underline{Z}_{0LB} - \underline{Z}_{0m}}{\underline{Z}_{0LA} - \underline{Z}_{0m}}$$

and $K_1, L_1, M_1$ according to $K_1 = -Z_{1LA}(Z_{1sA} + Z_{1sB} + Z_{1LB})$ $L_1 = -K_1 + Z_{1LB}Z_{1sB}$ $M_1 = Z_{1LA}Z_{1LB} + Z_{1LA}(Z_{1sA} + Z_{1sB}) + Z_{1LB}(Z_{1sA} + Z_{1sB})$.

11. The method according to claim 1, further comprising determining the distance to a single phase to ground fault without measurements from switched off and grounded parallel line by means of complex coefficients $P_0$ according to $$\underline{P}_0 = -\frac{\underline{Z}_{0LB}}{\underline{Z}_{0m}}$$

and $K_1, L_1, M_1$ according to $K_1 = -Z_{1LA}$ $L_1 = Z_{1LA} + Z_{1sB}$ $M_1 = Z_{1sA} + Z_{1sA} + Z_{1LA}$.

12. The method according to claim 1, further comprising determining the distance to a single ground fault using a first order formula of the form:

$$d = \frac{\text{imag}\{\underline{V}_{AA\_p}[3(I_{AA0} - \underline{P}_0 I_{AB0})]^*\}}{\text{imag}\{(Z_{1LA}I_{AA\_p})[3(I_{AA0} - \underline{P}_0 I_{AB0})]^*\}}.$$

13. The method according to claim 1, further comprising determining the distance to a phase-to-phase ground fault using pre-fault measurements and a first order formula of the form:

$$d = \frac{\text{imag}\{\underline{V}_{AA\_p}[\underline{W}(I_{AA0} - \underline{P}_0 I_{AB0})]^*\}}{\text{imag}\{(Z_{1LA}I_{AA\_p})[\underline{W}(I_{AA0} - \underline{P}_0 I_{AB0})]^*\}}.$$

14. The method according to claim 1, further comprising determining the distance to a phase-to-phase ground fault avoiding pre-fault measurements and using a first order formula of the form:

$$d = \frac{\text{imag}[(\underline{V}_a + \underline{V}_b)(I_{AA0} - \underline{P}_0 I_{AB0})^*]}{\text{imag}[Z_{1LA}(I_a + I_b + 2k_0 I_{AA0} 2k_{0m} I_{AB0})(I_{AA0} - \underline{P}_0 I_{AB0})^*]}.$$

15. A device for locating a fault from one end of a section of a power line having means for receiving and storing measurements of current, voltage and angles between the phases at one first end, means for receiving and storing a detection of a fault condition between said first and second ends, the device comprising:
means for calculating symmetrical components of currents for said current and voltage measured at said first end,
means for calculating a value of impedance for an extra link between the terminals,
means for determining a compensation for shunt capacitance,
means for determining the zero-sequence current from the healthy line of a section of parallel power lines,
means for calculating a distance to a fault for the parallel line section,
means for calculating a distance from said first end to the fault.

16. The device according to claim 15, further comprising:
means for determining a value for source impedance at said first end,
means for determining a value for source impedance at said second end.

17. The device according to claim 15, further comprising:
means for receiving a measurement of source impedance at said first end.

18. The device according to claim 15, further comprising:
means for receiving a measurement of source impedance made at said second end.

19. The device according to claim 15, further comprising
means to receive a measured value for remote source impedance at said second end communicated by means of a communication channel.

20. Use of a fault locator device according to claim 15, by a human operator to supervise a function in an electrical power system.

21. Use of a fault locator device according to claim 15, by means of a process running on one or more computers to supervise and/or control a function in an electrical power system.

22. Use of a fault locator device according to claim 15, to locate a distance to a fault in a power transmission or distribution system.

23. Use of a device according to claim 15, for locating a fault on parallel power lines.

24. A computer program product, comprising
a computer readable medium; and
computer code means and/or software code portions recorded on the computer readable medium for making a computer or processor perform a method for locating a fault from one end of a section of a power line by means of measurements of current, voltage and angles between the phases at a first end of said section, the method comprising
calculating symmetrical components of currents for said current and voltage measurement at said first end,
calculating a value of impedance for an extra link between the terminals with the impedance for the positive sequence equal to:

$$\left(Z_{1LB\&AB} = \frac{Z_{1LB}Z_{1AB}}{Z_{1LB} + Z_{1AB}}\right) \text{ where:}$$

$Z_{1AB}$=impedance for the positive sequence of the extra link, $Z_{1LA}$=positive-sequence impedance of the healthy line, determining a compensation for the shunt capacitance with the aid of an equation of the form:

$$B_2^{comp\_1}(d_{comp\_1})^2 + B_1^{comp\_1}d_{comp\_1} + B_0^{comp\_1} = 0$$

where:

$$B_2^{comp\_1} = A_{2\_Re}^{comp\_1}A_{00\_Im}^{comp\_1} - A_{2\_Im}^{comp\_1}A_{00_{Re}}^{comp\_1}$$

$$B_1^{comp\_1} = A_{1\_Re}^{comp\_1}A_{00\_Im}^{comp\_1} - A_{1\_Im}^{comp\_1}A_{00_{Re}}^{comp\_1}$$

$$B_0^{comp\_1} = A_{0\_Re}^{comp\_1}A_{00\_Im}^{comp\_1} - A_{0\_Im}^{comp\_1}A_{00_{Re}}^{comp\_1}$$

determining the zero-sequence current from the healthy line of a section of parallel power lines, calculating a distance to a fault for the parallel line section, calculating the distance to the fault from said first end using a quadratic equation of the form:

$$B_2d^2 + B_1d + B_0 = 0 \text{ where:}$$

$$B_2 = A_{2\_Re}A_{00\_Im} - A_{2Im}A_{00\_Re}$$

$$B_1 = A_{1\_Re}A_{00\_Im} - A_{1Im}A_{00\_Re}$$

$$B_0 = A_{0\_Re}A_{00\_Im} - A_{0Im}A_{00\_Re} \text{ and}$$

locating the fault utilizing the calculated distances.

* * * * *